(12) United States Patent  
Hashinoki et al.

(10) Patent No.: US 7,229,240 B2  
(45) Date of Patent: Jun. 12, 2007

(54) SUBSTRATE PROCESSING APPARATUS AND SUBSTRATE PROCESSING METHOD

(75) Inventors: Kenji Hashinoki, Kyoto (JP); Yasufumi Koyama, Kyoto (JP); Takaharu Yamada, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/947,480

(22) Filed: Sep. 22, 2004

(65) Prior Publication Data

US 2005/0061240 A1  Mar. 24, 2005

(30) Foreign Application Priority Data

Sep. 22, 2003  (JP) ............................. 2003-330095

(51) Int. Cl.
 B65G 25/00  (2006.01)
 B65G 67/16  (2006.01)
 G06F 7/00   (2006.01)

(52) U.S. Cl. ...................... 414/147; 414/935; 414/804; 700/218; 700/228

(58) Field of Classification Search ................ 414/147, 414/935, 937, 161, 222.01, 804, 806, 808, 414/810; 700/121, 218, 228; 118/500
See application file for complete search history.

(56) References Cited

U.S. PATENT DOCUMENTS

| 5,015,177 | A | * | 5/1991 | Iwata ......................... 432/121 |
| 5,202,716 | A | * | 4/1993 | Tateyama et al. ........... 396/624 |
| 5,436,848 | A |   | 7/1995 | Nishida et al. |
| 5,687,085 | A | * | 11/1997 | Morimoto et al. .......... 700/121 |
| 5,700,127 | A | * | 12/1997 | Harada et al. ......... 414/416.08 |
| 6,012,894 | A | * | 1/2000 | Watanabe et al. ........... 414/806 |
| 6,282,457 | B1 | * | 8/2001 | Miura et al. ................. 700/121 |
| 2002/0160621 | A1 | * | 10/2002 | Joma et al. .................. 438/758 |
| 2003/0185561 | A1 | * | 10/2003 | Inagaki ........................ 396/611 |
| 2003/0213431 | A1 |   | 11/2003 | Fukutomi et al. |
| 2004/0005149 | A1 | * | 1/2004 | Sugimoto et al. ........... 396/564 |

FOREIGN PATENT DOCUMENTS

| JP | 4-113612 | 4/1992 |
| JP | 11-54587 | 2/1999 |

* cited by examiner

*Primary Examiner*—Patrick Mackey  
*Assistant Examiner*—Gregory Adams  
(74) *Attorney, Agent, or Firm*—Ostrolenk, Faber, Gerb & Soffen, LLP

(57) ABSTRACT

When the processing temperature in a heater should be changed between lots, for example, a foremost substrate in a subsequent lot is transported to a position close to the heater such as a substrate holding part, and is held in standby thereat until adjustment of a processing environment (namely, change of the processing temperature) is completed. The substrate held in standby is thereafter transported to the heater. As compared with the case in which substrates are placed in standby in an indexer, substrates can be fed faster to the heater after change of the processing temperature, thereby suppressing throughput reduction.

9 Claims, 15 Drawing Sheets

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method for performing a series of processes on semiconductor substrates, glass substrates for liquid crystal displays, glass substrates for photomasks, substrates for optical disks and the like (hereinafter simply referred to as "substrates"), and it more specifically relates to improvement in control of substrate transport.

2. Description of the Background Art

A substrate processing apparatus may require time to control processing environment in a certain processing unit.

A heating unit in a substrate processing apparatus serves for heating of substrates. As an example, when two or more lots require different processing temperatures for heating and substrates in each lot are all to be subjected to heating, the processing temperature in the heating unit should be adjusted between the lots. As a particular example, when one lot requires a temperature of 65° C. for heating whereas a subsequent lot requires a temperature of 75° C., the processing temperature in the heating unit should be raised after heating of the last substrate in the previous lot is finished.

If the substrates in the subsequent lot are carried into the heating unit without waiting for sufficient rise of the processing temperature, processing temperature for heating differs between substrates at the beginning of the subsequent lot and other substrates of the same lot after temperature adjustment, thus producing a mixture of substrates with different characteristics in the same lot.

A tact transport control system serves to prevent such a problem in which substrate transport is controlled on the basis of tact time (the time interval between start of a substrate process at a certain processing part and start of the same process on a subsequent substrate at the same processing part). An example of this control system is introduced in Japanese Patent Application Laid-Open No. 4-113612 (1992). In this publication, standby time until a substrate is carried into a processing unit and tact time are controlled so that substrates are provided with uniform processing, even in a transition period required for change of a processing environment.

A sequential transport control system for sequentially transporting a plurality of substrates with minimum possible interruption with no dependence on tact time has no concept of time-base control such as control depending on standby time or tact time. That is, the sequential transport control system cannot control time interval and timing in substrate transport, and hence, stop of transport may be the first policy in the necessity for standby of substrate transport. By way of example, in the event that the sequential transport control system encounters the foregoing necessity of adjusting processing temperature in a heating unit between lots, the system makes an indexer (serving to receive unprocessed substrates, to feed unprocessed substrates to the processing apparatus, and to transfer processed substrates to the outside) stop feed of substrates into the processing apparatus.

Such a course of action is introduced in FIG. 15 which shows an exemplary transport path and exemplary locations of substrates in a substrate processing apparatus. With reference to FIG. 15, a substrate passes an indexer ID, an adhesion processing unit (discussed below) AHL, an anti-reflection film processor ARC, a heating plate HP1, a heater PHP1 as a heating unit, a photoresist spin coater SC, cooling plates CP1 and CP2, and a substrate holding part PASS3 in a predetermined order which together form the transport path.

It is assumed that a substrate Wb in one lot is being subjected to heating at the heater PHP1 in the substrate processing apparatus, and the heater PHP1 is to change its processing temperature thereafter. The sequential transport control system sequentially transports substrates with minimum possible interruption. Therefore, when a substrate in a subsequent lot exists in the photoresist spin coater SC as an ante-stage of the heater PHP1, this substrate in the subsequent lot is carried from the photoresist spin coater SC into the heater PHP1 prior to completion of the change of the processing temperature, thus producing a mixture of substrates with different characteristics in the same lot as discussed.

In response, transport of a substrate Wa in the subsequent lot that requires change of the processing temperature is held in standby without being fed from the indexer ID as shown in FIG. 15. At the time when the change of the processing temperature is completed in the heater PHP1, transport of substrates is restarted from the indexer ID.

Suspension of transport in this manner puts substrate transport on hold until feed is restarted, which inevitably causes throughput reduction.

SUMMARY OF THE INVENTION

It is an object of the present invention to provide a substrate processing apparatus and a substrate processing method allowing suppression of throughput reduction, even in the event that the substrate processing apparatus employs a sequential transport control system and makes time-consuming adjustment of a processing environment in a certain processing unit.

A first aspect of the present invention is intended for a substrate processing apparatus employing a sequential transport control system in which a plurality of substrates are sequentially transported with no dependence on tact time, comprising: an indexer for receiving unprocessed substrates to feed the unprocessed substrates into the substrate processing apparatus; a processing unit responsible for a predetermined process on the substrates, the processing unit capable of adjusting a processing environment for the predetermined process; a holding part located in a post-stage of the indexer and in an ante-stage of the processing unit, the holding part capable of placing thereon at least one of the substrates fed from the indexer; and a transport mechanism for carrying the substrates between a plurality of positions including the holding part and the processing unit, wherein in the event of adjustment of the processing environment, the processing unit notifies the transport mechanism of completion of adjustment at the time of completion, wherein in the event of adjustment of the processing environment in the processing unit, the transport mechanism continues to transport substrates that follow a foremost substrate among the substrates not reaching the processing unit until the foremost substrate is placed on the holding part, thereafter stopping transport process of the foremost substrate and the substrates following the foremost substrate, and restarts the transport process after receipt of the notification of completion of adjustment.

Preferably, according to a second aspect of the present invention, in the substrate processing apparatus of the first aspect, the processing unit is a heating part, and adjustment of the processing environment is temperature adjustment for changing a processing temperature for substrate heating process.

Preferably, according to a third aspect of the present invention, in the substrate processing apparatus of the first aspect, the processing unit is a liquid coater, and adjustment of the processing environment is cleaning of the liquid coater.

A fourth aspect of the present invention is intended for a method of controlling a substrate processing apparatus in which a plurality of substrates are sequentially transported independently of tact time from an indexer to a processing unit via a substrate holding part. The method comprises the steps of: a) starting adjustment of a processing environment in the processing unit; b) transporting a first substrate to the substrate holding part and transporting a second substrate to follow the first substrate; c) stopping respective transportations of the first and second substrates when the first substrate reaches the substrate holding part; d) completing the adjustment of the processing environment in the processing unit; and e) restarting transportation of the first and second substrates in response to completion of the adjustment of the processing environment.

Preferably, according to a fifth aspect of the present invention, in the method of the fourth aspect, the processing unit is a heating part, and adjustment of the processing environment is temperature adjustment for changing a processing temperature for substrate heating process.

Preferably, according to a sixth aspect of the present invention, in the method of the fourth aspect, the processing unit is a liquid coater, and adjustment of the processing environment is cleaning of the liquid coater.

Preferably, according to a seventh aspect of the present invention, in the method of the fourth aspect, the step c) comprises the steps of c-1) transporting the second substrate to a non-heating position, and c-2) stopping the second substrate at the non-heating position.

According to the first and fourth aspects of the present invention, in the event of adjustment of the processing environment in the processing unit, substrates that follow a foremost substrate among the substrates not reaching the processing unit continue to be transported until the foremost substrate is placed on the holding part. The transport process of the foremost substrate and the substrates following the foremost substrate is thereafter stopped. After completion of adjustment of the processing environment, the transport process is restarted. As compared with the case in which substrates are placed in standby in the indexer, substrates are fed faster to the processing unit after adjustment of the processing environment. As a result, throughput reduction can be suppressed.

According to the second and fifth aspects of the present invention, the processing unit is a heating part, and adjustment of the processing environment is temperature adjustment for changing a processing temperature for substrate heating process. As compared with the case in which substrates are placed in standby in the indexer, substrates are fed faster to the processing unit after temperature adjustment for changing the processing temperature. As a result, throughput reduction can be suppressed.

According to the third and sixth aspects of the present invention, the processing unit is a liquid coater, and adjustment of the processing environment is cleaning of the liquid coater. As compared with the case in which substrates are placed in standby in the indexer, substrates are fed faster to the processing unit after cleaning. As a result, throughput reduction can be suppressed.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

A first preferred embodiment of the present invention will be described in detail with reference to the drawings.

<1. Configuration of Substrate Processing Apparatus>

Figure 1:
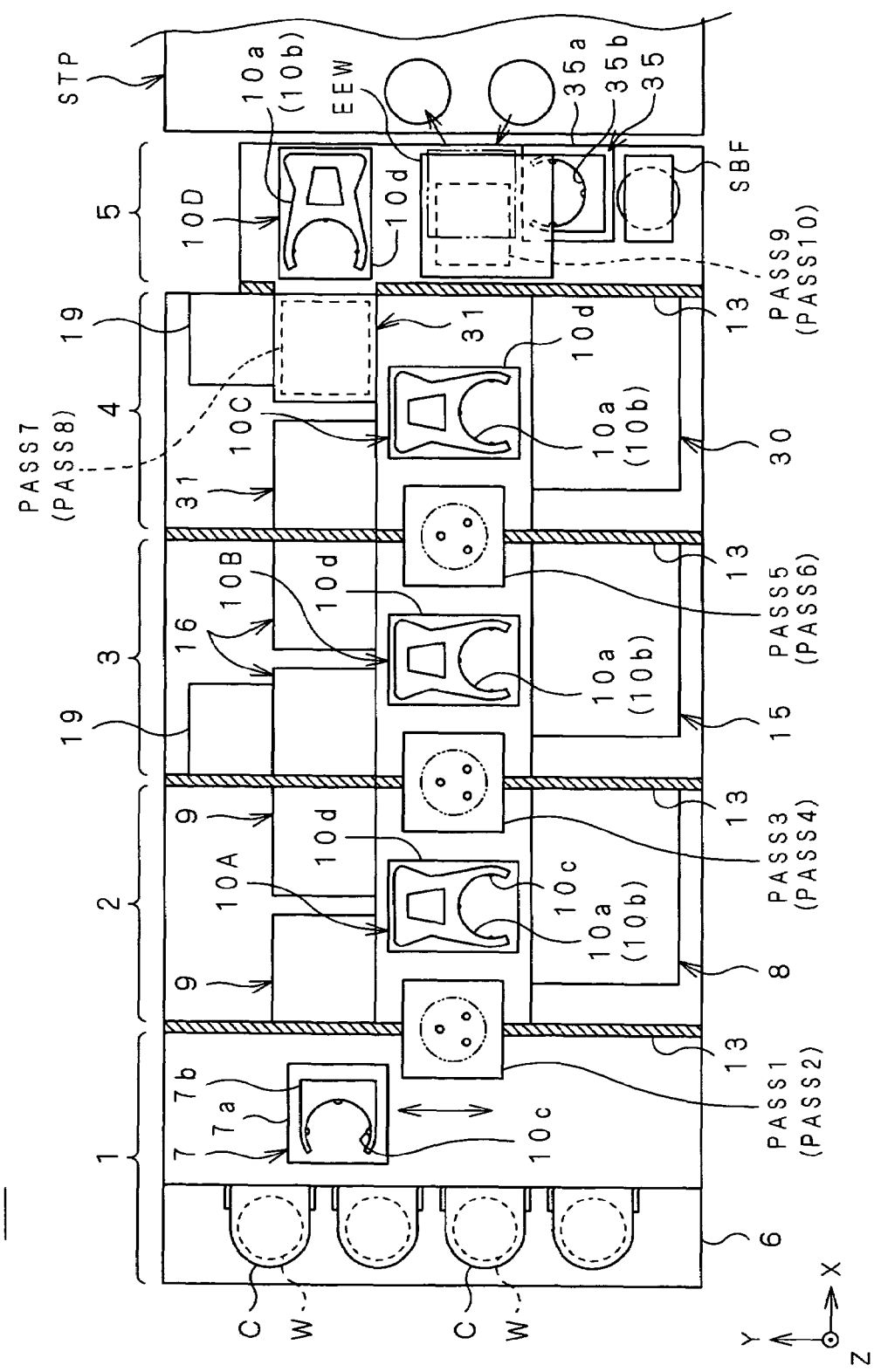
FIG. 1 is a plan view of the schematic configuration of a substrate processing apparatus according to the present invention.

FIG. 1 is a plan view of a substrate processing apparatus 100 according to the first preferred embodiment. By way of example, the substrate processing apparatus 100 serves to form an anti-reflection film and a photoresist film on a substrate, and to perform processing such as development by means of a liquid chemical on an exposed substrate. In FIG. 1 and figures following FIG. 1, an XYZ orthogonal coordinate system is shown where appropriate to provide clarity in directional relation between the figures in which the vertical direction is defined as a Z axis direction and the horizontal plane as an XY plane.

With reference to FIG. 1, the substrate processing apparatus 100 of the first preferred embodiment principally comprises a juxtaposition of an indexer block 1, three processing blocks responsible for a certain liquid chemical process on substrates (which specifically include an anti-reflection film processing block 2, a resist film processing block 3, and a development block 4), and an interface block 5. An exposure device (stepper) STP which is an external device not forming the substrate processing apparatus 100 of the first preferred embodiment is located next to the interface block 5.

In the substrate processing apparatus 100, certain supply means not shown supplies a downflow of clean air into each block, which prevents adverse effects of raised particles and gas flows upon the processes.

Each block is held at a slightly positive pressure inside relative to the outside to prevent entry of particles and contaminants. In particular, the air pressure within the anti-reflection film processing block 2 is set to be higher than that within the indexer block 1. The atmosphere within the indexer block 1 is thus prevented from flowing into the anti-reflection film processing block 2, whereby each processing block is allowed to perform its process without being influenced by the outside atmosphere.

The indexer block 1 serves to receive unprocessed substrates W from the outside of the substrate processing apparatus 100 and to transfer processed substrates W to the outside. The indexer block 1 comprises a cassette table 6 for placing thereon a plurality of (in FIG. 1, four) cassettes C in a row each capable of storing a predetermined number of substrates W in tiers, and an indexer-specific transport mechanism 7 for taking out unprocessed substrates W in order from the cassettes C for post-stage processing and for receiving processed substrates W to return the same to the cassettes C in order.

Figure 2:
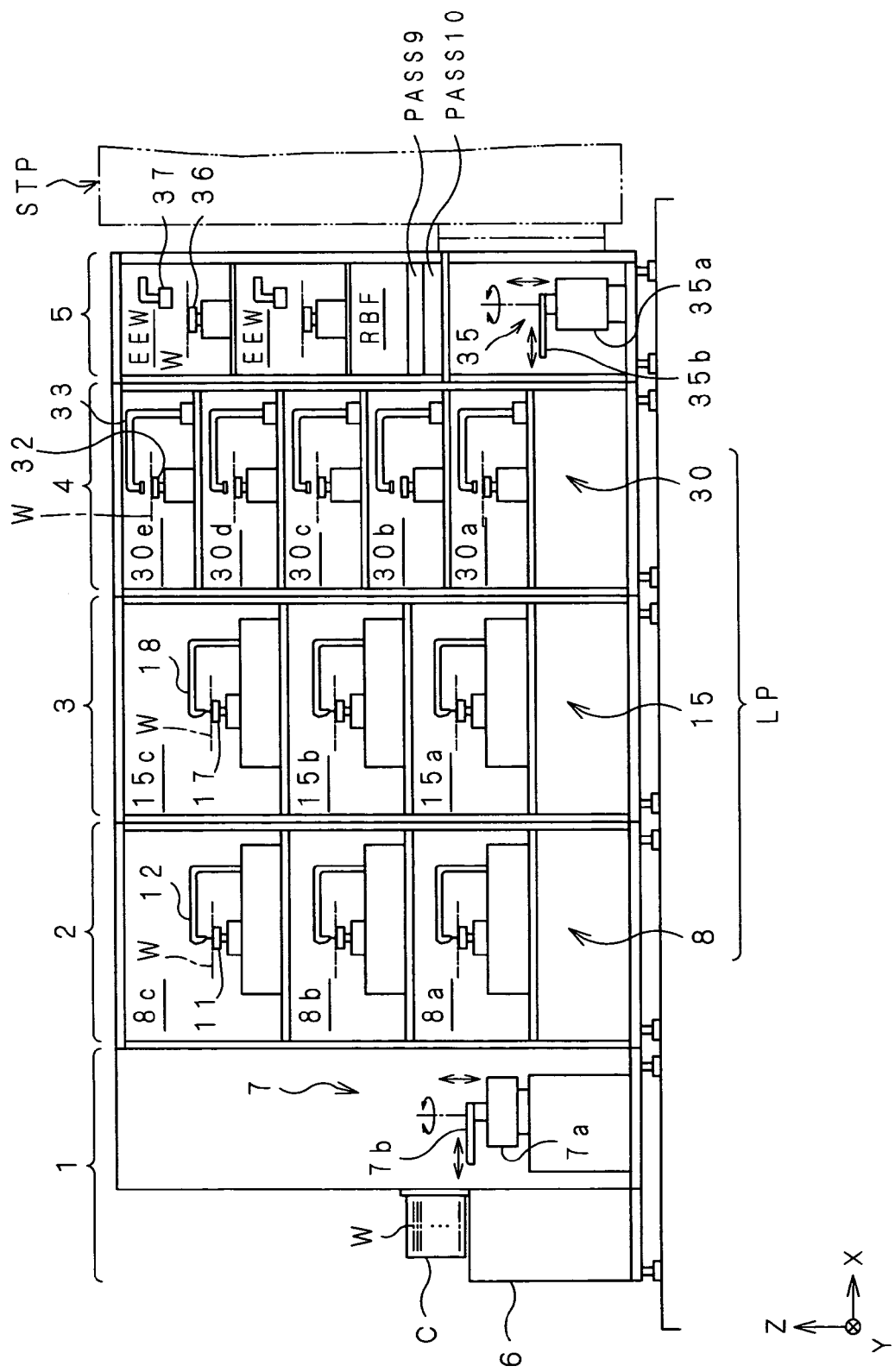
FIG. 2 is a front view of the schematic configuration of the substrate processing apparatus according to the present invention.

The indexer-specific transport mechanism 7 includes a movable table 7a horizontally movable along the Y axis toward and away from the cassette table 6, a holding arm 7b provided over the movable table 7a for holding a substrate W in a horizontal position, and a plurality of (in FIG. 1, three) pins 10c projecting inwardly from a distal end portion of the holding arm 7b (see FIG. 2). The holding arm 7b is capable of moving vertically along the Z axis, pivoting within the horizontal plane, and moving back and forth in the direction of the pivot radius. A substrate W is held in the horizontal position by the pins 10c.

With reference to FIG. 1, the boundary between the indexer block 1 and the anti-reflection film processing block 2 adjacent thereto is provided with a partition 13 which serves to provide atmospheric isolation between the indexer block 1 and the anti-reflection film processing block 2. The partition 13 is provided with upper and lower substrate holding parts PASS1 and PASS2 that partially penetrate the partition 13.

It will be briefly discussed how a substrate W is transferred in the indexer block 1. First, the indexer-specific transport mechanism 7 moves horizontally to a position opposed to a predetermined one of the cassettes C. Next, the holding arm 7b moves up and down, further moving back and fourth to take out an unprocessed substrate W from the cassette C. With the substrate W held by the holding arm 7b, the indexer-specific transport mechanism 7 moves horizontally to a position opposed to the substrate holding parts PASS1 and PASS2 discussed below.

The indexer-specific transport mechanism 7 transfers the substrate W held on the holding arm 7b onto the upper substrate holding part PASS1 for outward transfer of substrates. If a processed substrate W is placed on the lower substrate holding part PASS2 for return of substrates, the indexer-specific transport mechanism 7 receives the processed substrate W on the holding arm 7b to store the same into a predetermined one of the cassettes C. The indexer-specific transport mechanism 7 repeats the process including taking of an unprocessed substrate W out of the cassette C to transport the same to the substrate holding part PASS1, and receipt of a processed substrate W from the substrate holding part PASS2 to store the same into the cassette C.

Figure 3:
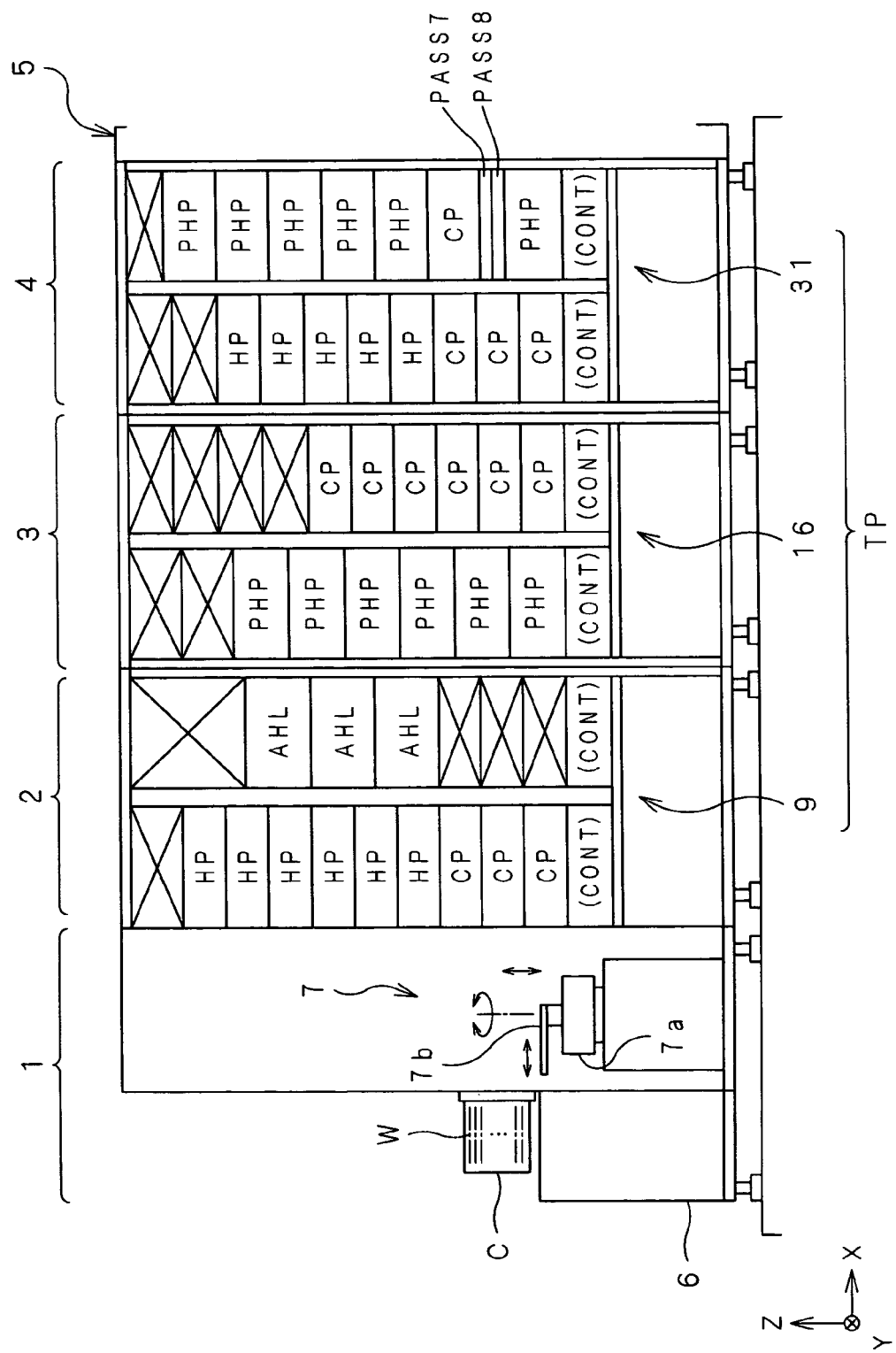
FIG. 3 shows the arrangement in a thermal processor in the present invention.

FIG. 2 is a front view of the substrate processing apparatus 100. FIG. 3 shows the arrangement of a thermal processor TP as seen in the same direction as in FIG. 2. The anti-reflection film processing block 2 is responsible for formation of an anti-reflection film for reducing standing waves or halation occurring during exposure in the exposure device STP under a photoresist film. The anti-reflection film processing block 2 comprises a first coating processor 8 (including coating processing units 8a through 8c) for coating the surface of a substrate W with an anti-reflection film, a first thermal processor 9 (including a plurality of heating plates HP, cooling units (plates) CP and adhesion processing units AHL) responsible for thermal process required for the coating, and a first main transport mechanism 10A for transferring and receiving a substrate W to and from the first coating processor 8 and the first thermal processor 9.

The first main transport mechanism 10A is a transport robot having a hardware configuration which is the same as those of main transport mechanisms 10B through 10D discussed below. The first main transport mechanism 10A has a base 10d, and two (upper and lower) holding arms 10a and 10b (only one of which is shown in FIG. 1) that are provided on the base 10d. The holding arms 10a and 10b each have a substantially C-shaped distal end portion provided with a plurality of (in FIG. 1, three) pins 10c projecting inwardly therefrom. The pins 10c serve to hold a substrate W in a horizontal position. The holding arms 10a and 10b are driven by a driving mechanism not shown to be capable of pivoting within the horizontal plane, moving vertically along the Z axis, and moving back and forth in the direction of the pivot radius.

With reference to FIG. 1, the boundary between the anti-reflection film processing block 2 and the resist film processing block 3 adjacent thereto is provided with a partition 13 which serves to provide atmospheric isolation between the anti-reflection film processing block 2 and the resist film processing block 3. The partition 13 is provided with upper and lower substrate holding parts PASS3 and PASS4 that partially penetrate the partition 13. That is, the substrate holding parts PASS3 and PASS4 serve to transfer a substrate W between the first main transport mechanism 10A in the anti-reflection film processing block 2 and the second main transport mechanism 10B in the resist film processing block 3. The upper substrate holding part PASS3 is intended for outward transfer of substrates, whereas the lower substrate holding part PASS4 is intended for return of substrates.

A substrate W after being formed with an anti-reflection film at the anti-reflection film processing block 2 is transferred onto the upper substrate holding part PASS3 by the first main transport mechanism 10A. The substrate W placed on the substrate holding part PASS3 is carried into the resist film processing block 3 by the second main transport mechanism 10B in the resist film processing block 3. A substrate W after being subjected to exposure, post-exposure baking and development at the exposure device STP and the development block 4 is transferred onto the lower substrate holding part PASS4 by the second main transport mechanism 10B, thereafter entering the anti-reflection film processing block 2 by means of the first main transport mechanism 10A in the anti-reflection film processing block 2. That is, a substrate W is transferred to and from the anti-reflection film processing block 2 and the resist film processing block 3 by way of the substrate holding parts PASS3 and PASS4.

In the anti-reflection film processing block 2, the first coating processor 8 and the first thermal processor 9 are respectively positioned on the front side and the rear side of the substrate processing apparatus 100, with the first main transport mechanism 10A held therebetween. Such an arrangement suppresses thermal effect on the first coating processor 8 caused by the first thermal processor 9. The front side of the first thermal processor 9 (on the side of the first main transport mechanism 10A) is provided with a thermal barrier not shown which also avoids thermal effect on the first coating processor 8.

The resist film processing block 3 is responsible for formation of a photoresist film on a substrate W formed with an anti-reflection film. The first preferred embodiment uses a chemically amplified resist as a photoresist. The resist film processing block 3 comprises a second coating processor 15 (including coating processing units 15a through 15c) for coating with a photoresist film, a second thermal processor 16 (including a plurality of heaters PHP equipped with temporary substrate holding parts and a plurality of cooling units CP) responsible for thermal process required for the coating, and the second main transport mechanism 10B for transferring and receiving a substrate W to and from the second coating processor 15 and the second thermal processor 16.

With reference to FIG. 1, the boundary between the resist film processing block 3 and the development block 4 adjacent thereto is provided with a partition 13 which serves to provide atmospheric isolation between the resist film processing block 3 and the development block 4. The partition 13 is provided with upper and lower substrate holding parts PASS5 and PASS6 that partially penetrate the partition 13. That is, the substrate holding parts PASS5 and PASS6 serve to transfer a substrate W between the second main transport mechanism 10B in the resist film processing block 3 and the third main transport mechanism 10C in the development block 4. The upper substrate holding part PASS5 is intended for outward transfer of substrates, whereas the lower substrate holding part PASS6 is intended for return of substrates.

A substrate W after being subjected to resist coating at the resist film processing block 3 is transferred onto the upper substrate holding part PASS5 by the second main transport mechanism 10B. The substrate W placed on the substrate holding part PASS5 is carried into the development block 4 by the third main transport mechanism 10C in the development block 4. A substrate W after being subjected to exposure, post-exposure baking and development at the exposure device STP and the development block 4 is transferred onto the lower substrate holding part PASS6 by the third main transport mechanism 10C, thereafter entering the resist film processing block 3 by means of the second main transport mechanism 10B in the resist film processing block 3. That is, a substrate W is transferred to and from the resist film processing block 3 and the development block 4 by way of the substrate holding parts PASS5 and PASS6.

In the resist film processing block 3, the second coating processor 15 and the second thermal processor 16 are respectively positioned on the front side and the rear side of the substrate processing apparatus 100, with the second main transport mechanism 10B held therebetween. Like in the anti-reflection film processing block 2, such an arrangement suppresses thermal effect on the second coating processor 15 caused by the second thermal processor 16. The front side of the second thermal processor 16 (on the side of the second main transport mechanism 10B) is provided with a thermal barrier not shown which also avoids thermal effect on the second coating processor 15.

The development block 4 is responsible for development upon a substrate W formed with a predetermined circuit pattern by exposure at the exposure device STP. The development block 4 comprises a development processor 30 for development using a developing solution, a third thermal processor 31 for thermal process required for the development, and the third main transport mechanism 10C for transferring and receiving a substrate W to and from the development processor 30 and the third thermal processor 31.

With reference to FIG. 2, the development processor 30 includes five development processing units 30a through 30e (which may be collectively identified as numeral "30" when distinction therebetween is not necessary) arranged in vertically stacked relation. The development processing units 30 each have a spin chuck 32 for rotating a substrate W while holding the same under suction in a horizontal position, a nozzle 33 for supplying a developing solution onto the substrate W held on the spin chuck 32 and the like.

With reference to FIG. 3, the third thermal processor 31 has a parallel arrangement of stacks of thermal processing parts including a plurality of heating plates HP, heaters PHP equipped with temporary substrate holding parts, and cooling plates CP for cooling a substrate W to a room temperature with a high degree of accuracy.

Figure 4A:
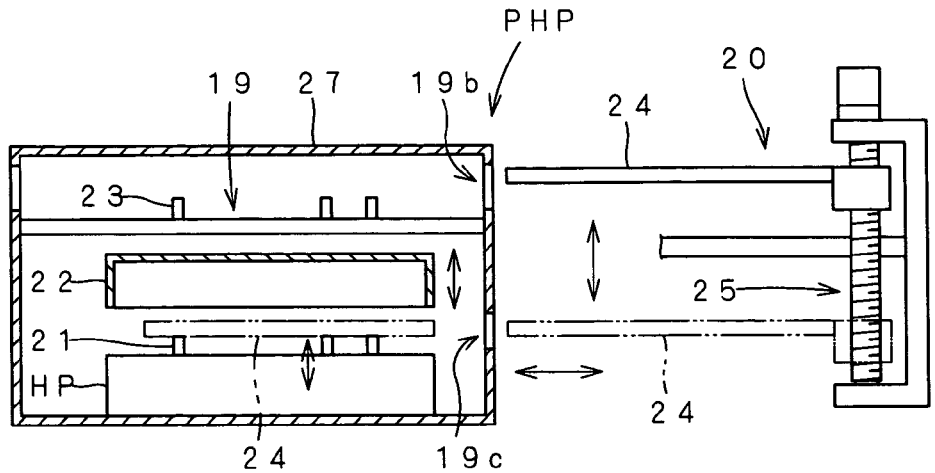
FIGS. 4A and 4B each show the schematic configuration of a heater equipped with a temporary substrate holding part according to the present invention.
Figure 4B:
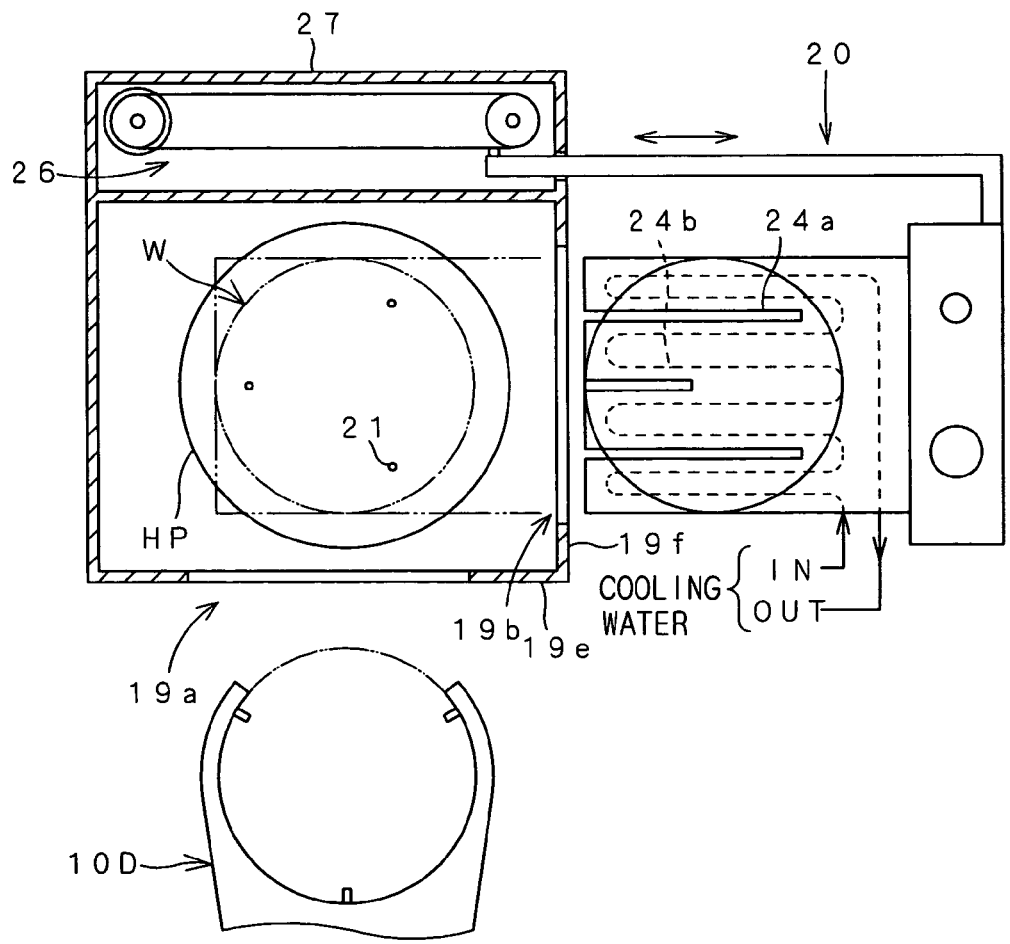

FIGS. 4A and 4B each schematically show the configuration of the heater PHP equipped with a temporary substrate holding part. The heater PHP has a heating plate (heating unit) HP for heating a substrate W placed thereon, a temporary substrate holding part 19 for holding a substrate W at a distant position from the heating plate HP that is either above or below the heating plate HP (in the first preferred embodiment, a substrate W is held above the heating plate HP), and a local transport mechanism 20 for transport of a substrate W between the heating plate HP and the temporary substrate holding part 19. The heating plate HP has a surface provided with a plurality of movable support pins 21 in a retractable manner. An upper lid 22 capable of making up and down movement is provided above the heating plate HP to cover a substrate W during thermal process. The temporary substrate holding part 19 is provided with a plurality of fixing and support pins 23 to support a substrate W.

The local transport mechanism 20 has a holding plate 24 for holding a substrate W in a substantially horizontal position. The holding plate 24 moves up and down by a screw drive mechanism 25, and back and forth by a belt drive mechanism 26. The holding plate 24 is provided with a plurality of slits 24a to avoid interference with the movable support pins 21 or the fixing and support pins 23 when traveling to a position above the heating plate HP or above the temporary substrate holding part 19. The local transport mechanism 20 has a cooling unit for cooling a substrate W in the process of transporting the substrate W from the heating plate HP to the temporary substrate holding part 19.

As shown in FIG. 4B, the cooling unit of the local transport mechanism 20 may be a cooling water path 24b provided inside the local transport mechanism 20 which allows flow of cooling water therethrough. Alternatively, a cooling device not shown and the holding plate 24 may be connected to cool the holding plate 24 by means of heat transfer from the holding plate 24 to the cooling device. When a substrate W is held on the holding plate 24 thus cooled, the substrate W can be cooled by means of heat transfer from the substrate W to the holding plate 24.

With reference to FIG. 4B, the local transport mechanism 20 is so arranged to face a surface 19f adjoining a surface 19e which faces the fourth main transport mechanism 10D in the interface block 5 (see FIG. 4B). A casing 27 is provided to cover the heating plate HP and the temporary substrate holding part 19. In the upper portion of the casing 27, namely, in the portion for covering the temporary substrate holding part 19, the surface 19e is provided with an opening 19a allowing entry of the third main transport mechanism 10C, whereas the surface 19f is provided with an opening 19b allowing entry of the local transport mechanism 20. In the lower portion of the casing 27, namely, in the portion for covering the heating plate HP, the surface 19e has no opening whereas the surface 19f is provided with an opening 19c allowing entry of the local transport mechanism 20.

It will be discussed how a substrate W is transferred to and from the heater PHP. First, the third main transport mechanism 10C holds a substrate W and transfers the same onto the fixing and support pins 23 of the temporary substrate holding part 19; Next, the holding plate 24 of the local transport mechanism 20 travels to a position below the substrate W and then slightly moves up, to receive the substrate W from the fixing and support pins 23. The holding plate 24 holding the substrate W thereafter leaves the casing 27 and moves down to a height to face the heating plate HP. At this time, the movable support pins 21 of the heating plate HP move down to a height for heating which corresponds to the height of the contact surface between the lower surface of the substrate W and the upper surface of the holding plate 24, while the upper lid 22 moves up. The holding plate 24 holding the substrate W thereon then travels to a position above the heating plate HP. After the substrate W is received by the movable support pins 21 which has moved up to a higher position, the holding plate 24 leaves the casing 27. Next, the movable support pins 21 move down to transfer the substrate W onto the heating plate HP while the upper lid 22 moves down to cover the substrate W. The substrate W is subjected to thermal process under these conditions. After thermal process, the upper lid 22 rises to a higher position while the movable support pins 21 move up to lift the substrate W to a higher level. The holding plate 24 thereafter travels to a position under the substrate W, followed by descent of the movable support pins 21, whereby the substrate W is transferred onto the holding plate 24. The holding plate 24 holding the substrate W thereon leaves the casing 27, then moving up to transport the substrate W to the temporary substrate holding part 19. At the temporary substrate holding part 19, the substrate W held on the holding plate 24 is subjected to cooling by means of a cooling function of the holding plate 24. The holding plate 24 transfers the substrate W after being subjected to cooling (or the substrate W cooled to a room temperature) onto the fixing and support pins 23 in the temporary substrate holding part 19. Then, the substrate W is taken out to be transported by the third main transport mechanism 10C.

As discussed, the third main transport mechanism 10C serves to transfer a substrate W only to and from the temporary substrate holding part 19. Transfer of a substrate W does not occur between the third main transport mechanism 10C and the heating plate HP, thereby preventing temperature rise of the third main transport mechanism 10C.

In the third thermal processor 31, the right stack of the thermal processing parts (the stack next to the interface block 5) includes substrate holding parts PASS7 and PASS8 in close proximity arranged in vertically stacked relation that are responsible for transfer of a substrate W between the third main transport mechanism 10C in the development block 4 and the fourth main transport mechanism 10D in the interface block 5. The upper substrate holding part PASS7 is intended for outward transfer of substrates, whereas the lower substrate holding part PASS8 is intended for return of substrates.

A substrate W transported from the resist film processing block 3 into the development block 4 is transferred onto the substrate holding part PASS7 by the third main transport mechanism 10C. The fourth main transport mechanism 10D in the development block 4 then transports the substrate W placed on the substrate holding part PASS7 into the interface block 5. A substrate W after being subjected to exposure, post-exposure baking and development at the exposure device STP and the development block 4 is transferred onto the PASS6 by the third main transport mechanism 10C, thereafter entering the resist film processing block 3 by means of the second main transport mechanism 10B in the resist film processing block 3. That is, a substrate W is transferred to and from the resist film processing block 3 and the development block 4 by way of the substrate holding parts PASS5 and PASS6.

In the development block 4, the development processor 30 and third thermal processor 31 are respectively positioned on the front side and the rear side of the substrate processing apparatus 100, with the third main transport mechanism 10C held therebetween. Like in the anti-reflection film processing block 2 and the resist film processing block 3, such an arrangement suppresses thermal effect on the development processor 30 caused by the third thermal processor 31. The front side of the third thermal processor 31 (on the side of the third main transport mechanism 10C) is provided with a thermal barrier not shown which also avoids thermal effect on the development processor 30.

The interface block 5 serves to transfer a substrate W to and from the exposure device STP as an external device not forming the substrate processing apparatus 100. The interface block 5 of the substrate processing apparatus 100 comprises an interface-specific transport mechanism 35 for transferring a substrate W to and from the exposure device STP, two edge exposure units EEW for exposing the periphery of a substrate W coated with a photoresist, and the fourth main transport mechanism 10D for transferring and receiving a substrate W to and from the heater PHP in the development block 4 equipped with a temporary substrate holding part and the edge exposure unit EEW.

With reference to FIG. 2, the edge exposure units EEW each have a spin chuck 36 for rotating a substrate W while holding the same under suction in a horizontal position, a light irradiator 37 for exposing the periphery of the substrate W held on the spin chuck 36 to light, and the like. The two edge exposure units EEW are arranged in vertically stacked relation in the center of the interface block 5.

Figure 5:
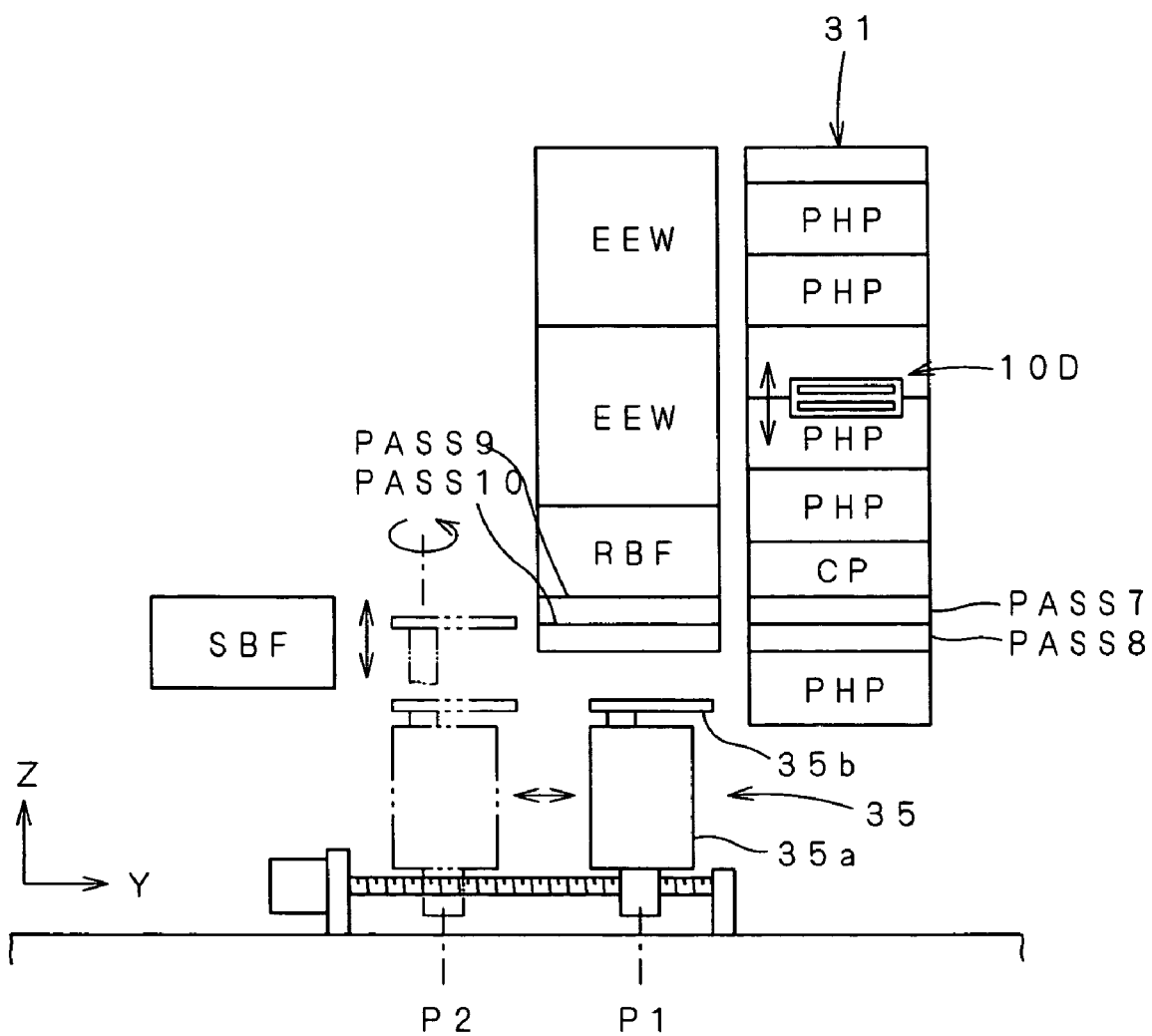
FIG. 5 is a side view of the schematic configuration of an interface block according to the present invention.

FIG. 5 is a side view of the interface block 5. A return buffer RBF is arranged under the two edge exposure units EEW. A vertical stack of the substrate holding parts PASS9 and PASS10 is provided under the return buffer RBF. In the event that the development block 4 fails to develop a substrate W due to breakdown therein, for example, the return buffer RBF serves to temporarily store a substrate W after being subjected to post-exposure thermal process at the heater PHP in the development block 4. The return buffer RBF has a cabinet capable of storing more than two substrates W in tiers. The substrate holding parts PASS9 and PASS10 serve to transfer a substrate W between the fourth main transport mechanism 10D and the interface-specific transport mechanism 35. The upper substrate holding part PASS9 is intended for outward transfer of substrates, whereas the lower substrate holding part PASS10 is intended for return of substrates.

With reference to FIGS. 1 and 5, the interface-specific transport mechanism 35 includes a movable table 35*a* capable of making horizontal movement along the Y axis, and a holding arm 35*b* provided over the movable table 35*a* for holding a substrate W. The holding arm 35*b* is capable of moving up and down, pivoting, and moving back and forth in the direction of the pivot radius. The range of movement of the interface-specific transport mechanism 35 extends to a position (P1 shown in FIG. 5) under the stack of the substrate holding parts PASS9 and PASS10, at which position a substrate W is transferred to and from the exposure device STP. At the opposite position P2 of the range of movement of the interface-specific transport mechanism 35, a substrate W is transferred to and from the substrate holding parts PASS9 and PASS10, and is also stored into and taken out from a feed buffer SBF which has a cabinet capable of storing more than two substrates W in tiers. In the event that the exposure device STP fails to accept a substrate W, the feed buffer SBF serves to temporarily store this substrate W before exposure.

<2. Control of Substrate Processing Apparatus>

Figure 6:
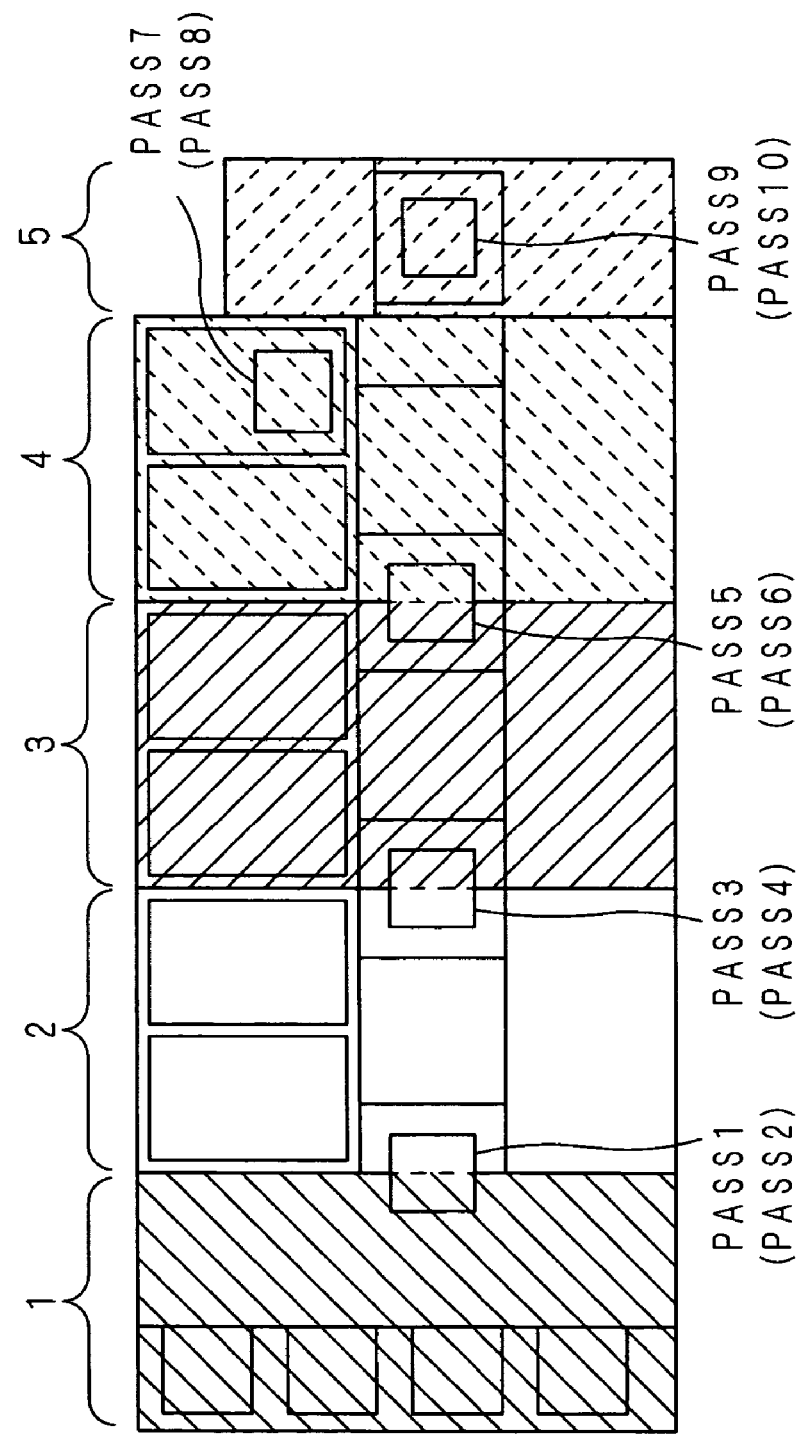
FIG. 6 is a plan view of the arrangement of blocks in the substrate processing apparatus according to the present invention.
Figure 7:
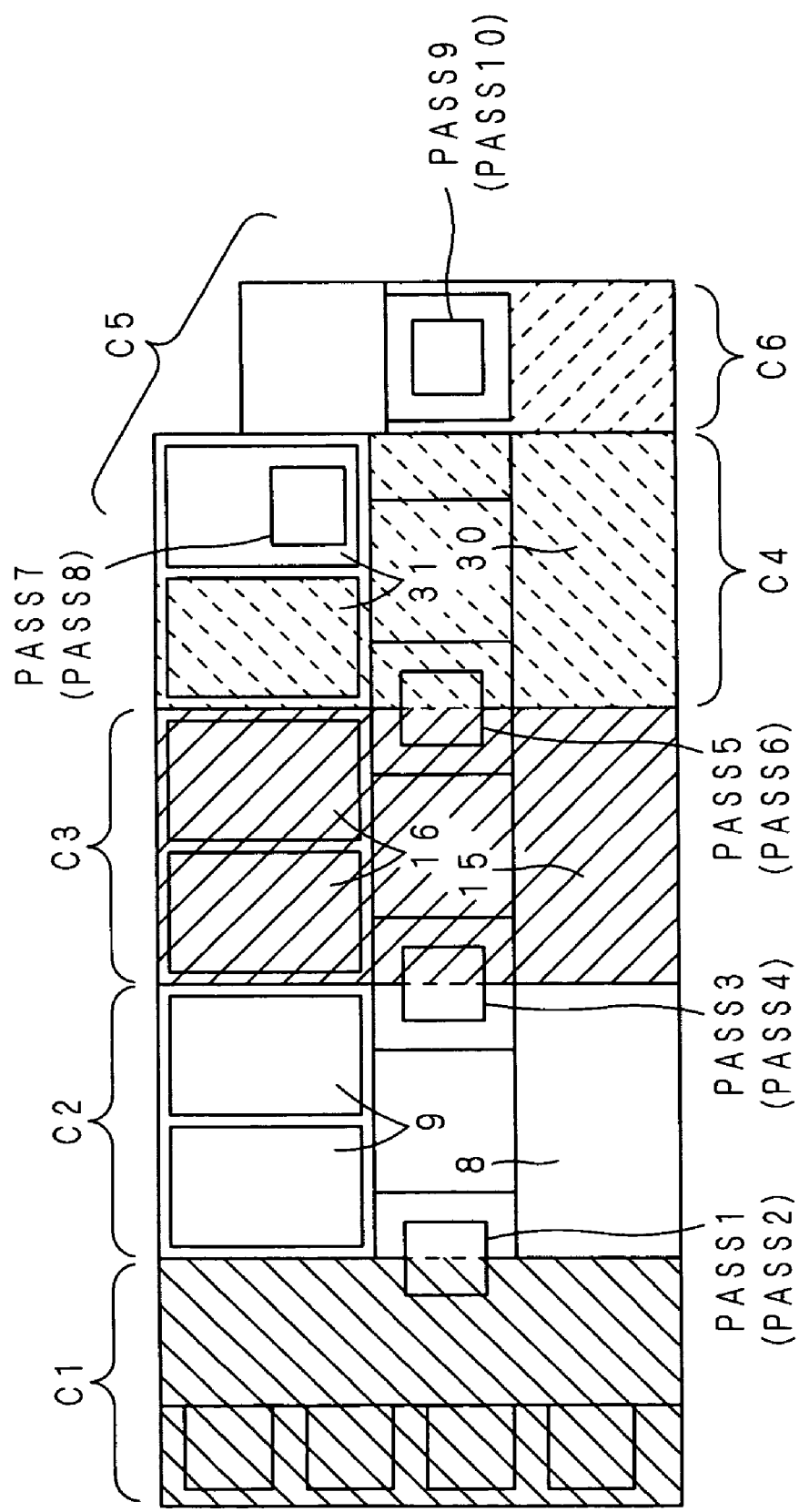
FIG. 7 is a plan view of the arrangement of cells in the substrate processing apparatus according to the present invention.
Figure 8:
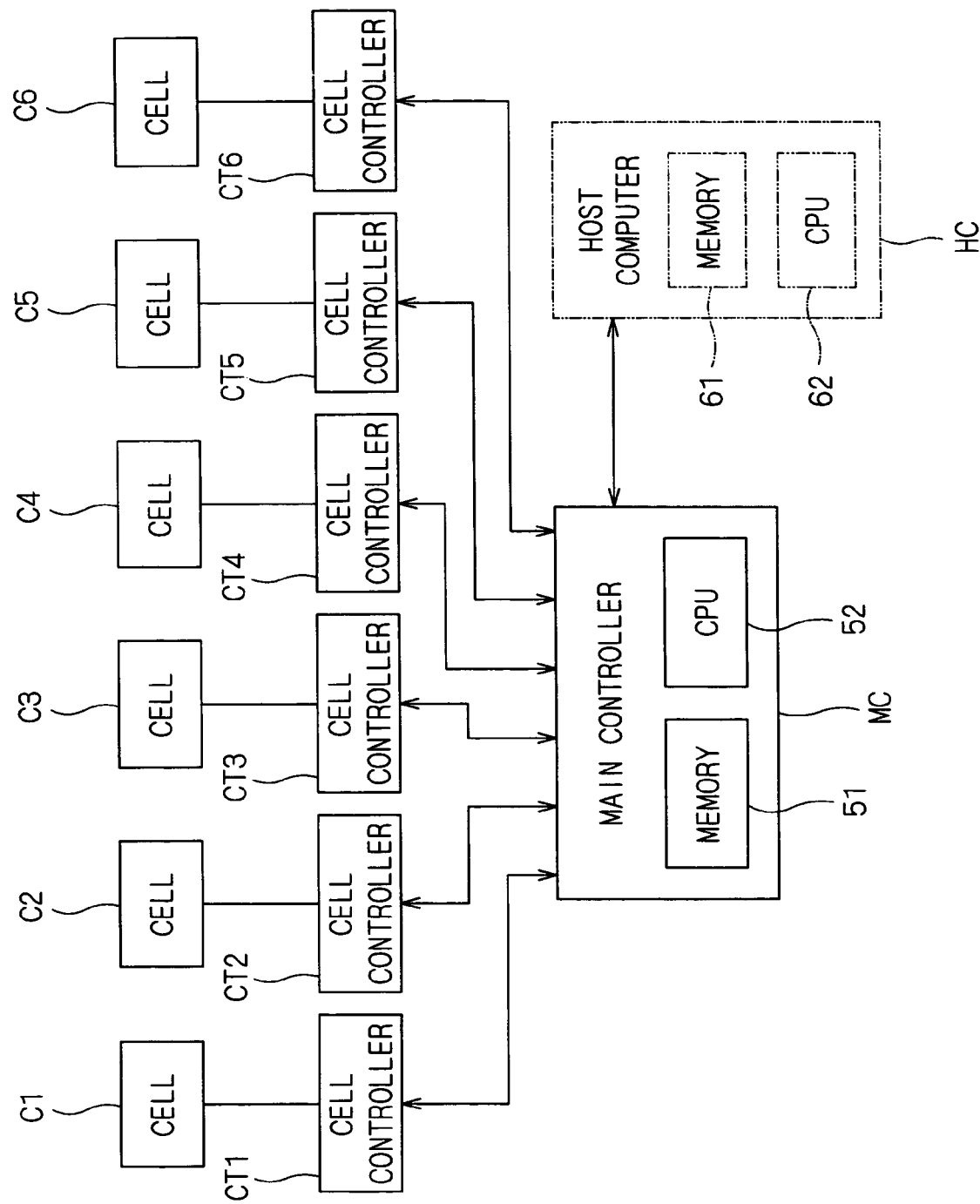
FIG. 8 is a block diagram of the schematic configuration of a control system in the substrate processing apparatus according to the present invention.

FIG. 6 is a plan view showing the arrangement of the blocks 1 through 5 in the substrate processing apparatus 100. FIG. 7 is a plan view showing the arrangement of cells in the substrate processing apparatus 100. FIG. 8 is a block diagram of a control system in the substrate processing apparatus 100. In the following, the control system in the substrate processing apparatus 100 according to the first preferred embodiment will be discussed.

As discussed, the substrate processing apparatus 100 is divided into the indexer block 1, the anti-reflection film processing block 2, the resist film processing block 3, the development block 4, and the interface block 5 (FIG. 6). In a substrate processing apparatus with a hardware configuration comprising a plurality of blocks, a conventional way of control is such that the blocks are provided with respective controllers, and progress in each block (including situation of thermal process of a substrate W at the heating plate HP therein and transport situation of a substrate W, for example) is controlled by the corresponding controller. In contrast, in the substrate processing apparatus 100 of the first preferred embodiment, the whole apparatus is divided into a plurality of elements that are so-called cells provided with respective controllers. These controllers are responsible for control of progress in the respective cells including processing situation and transport situation of a substrate W and the like.

In the first preferred embodiment, cells mean a plurality of elements as a result of division of the substrate processing apparatus 100 with respect to the indexer-specific transport mechanism 7, the main transport mechanisms 10A through 10D and the interface-specific transport mechanism 35 (which will be alternatively referred to as "substrate transport mechanisms"). That is, with reference to FIG. 7, the substrate processing apparatus 100 is divided into cells C1 through C6 each covering a range of transfer of a substrate W by corresponding one of the substrate transport mechanisms.

The indexer cell C1 corresponds to the indexer block 1. The indexer cell C1 serves to receive unprocessed substrates W from the outside of the substrate processing apparatus 100 and to transfer processed substrates W to the outside. That is, the indexer cell C1 is defined by division of the substrate processing apparatus 100 with respect to the indexer-specific transport mechanism 7. The indexer cell C1 mainly comprises the indexer-specific transport mechanism 7 and a cell controller CT1 (see FIG. 8) for controlling the indexer cell C1.

The anti-reflection film processing cell C2 corresponds to the anti-reflection film processing block 2, and is responsible for formation of an anti-reflection film. That is, the anti-reflection film processing cell C2 is defined by division of the substrate processing apparatus 100 with respect to the first main transport mechanism 10A. The anti-reflection film processing cell C2 mainly comprises the first main transport mechanism 10A, the first coating processor 8, the first thermal processor 9, and a cell controller CT2 (see FIG. 8). In response to the processing and transport situations of a substrate W present in the anti-reflection film processing cell C2, the cell controller CT2 controls the condition of each piece of hardware in the anti-reflection film processing cell C2.

The resist film processing cell C3 corresponds to the resist film processing block 3, and is responsible for formation of a photoresist film on a substrate W. That is, the resist film processing cell C3 is defined by division of the substrate processing apparatus 100 with respect to the second main transport mechanism 10B. The resist film processing cell C3 mainly comprises the second main transport mechanism 10B, the second coating processor 15, the second thermal processor 16, and a cell controller CT3 (see FIG. 8). In response to the processing and transport situations of a substrate W present in the resist film processing cell C3, the cell controller CT3 controls the condition of each piece of hardware in the resist film processing cell C3.

The development cell C4 corresponds to part of hardware in the development block 4, and is responsible for development upon a substrate W after exposure. That is, the development cell C4 is defined by division of the substrate processing apparatus 100 with respect to the third main transport mechanism 10C. The development cell C4 mainly comprises the third main transport mechanism 10C, the development processor 30, the heating plates HP and the cooling units CP in the left stack of the third thermal processor 31 shown in FIG. 3, and a cell controller CT4 (see FIG. 8). In response to the processing and transport situations of a substrate W present in the development cell C4, the cell controller CT4 controls the condition of each piece of hardware in the development cell C4.

The post-exposure thermal processing cell C5 corresponds to part of hardware in the development block 4 and part of hardware in the interface block 5, and is responsible for post-exposure thermal process upon a substrate W after being subjected to exposure. That is, the post-exposure thermal processing cell C5 is defined by division of the substrate processing apparatus 100 with respect to the fourth main transport mechanism 10D. The post-exposure thermal processing cell C5 mainly comprises the fourth main transport mechanism 10D, the heaters PHP and the cooling units CP in the right stack of the third thermal processor 31 shown in FIG. 3, the return buffer RBF, and a cell controller CT5 (see FIG. 8). In response to the processing and transport situations of a substrate W present in the post-exposure thermal processing cell C5, the cell controller CT5 controls the condition of each piece of hardware in post-exposure thermal processing cell C5.

The interface cell C6 corresponds to part of the interface block 5, and is responsible for transfer of a substrate W between the substrate processing apparatus 100 and the exposure device STP as an external device. That is, the interface cell C6 is defined by division of the substrate processing apparatus 100 with respect to the interface-specific transport mechanism 35. The interface cell C6 mainly comprises the interface-specific transport mechanism 35, the edge exposure units EEW, the feed buffer SBF, and a cell controller CT6 (see FIG. 8). In response to the processing and transport situations of a substrate W present in the interface cell C6, the cell controller CT6 controls the condition of each piece of hardware in the interface cell C6.

As discussed, the cells C1 through C6 can be independently controlled by the respective cell controllers CT1 through CT6. As shown in FIG. 8, the cell controllers CT1 through CT6 are connected to a main controller MC.

The main controller MC serves to control the operating state of the hardware in each of the cells C1 through C6 of the substrate processing apparatus 100, to thereby manage the semiconductor manufacturing process by the substrate processing apparatus 100. The main controller MC comprises a memory 51 for storing programs, variables and the like, and a CPU 52 responsible for control operation according to the programs stored in the memory 51. The main controller MC is communicatively connected to each of the cell controllers CT1 through CT6 through a cable or wireless network.

The main controller MC is thus allowed to receive data indicative of the operating state of each piece of hardware (such as the temperature in the heating plate HP and the transport situation of the substrate transport mechanism) sent from the cell controllers CT1 through CT6 respectively corresponding to the cells C1 through C6. On the basis of the received data indicative of the operating state, the main controller MC performs computation to obtain operating state of each piece of hardware that provides optimum substrate processing. The main controller MC further sends a control signal to a selected one of the cell controllers CT1 through CT6 for bringing the operating state of each piece of hardware therein to a certain condition (as an example, for adjusting the temperature of the heating plates HP in the anti-reflection film processing cell C2 to a certain temperature). As a result, each piece of hardware in each one of the cells C1 through C6 is allowed to operate in an optimized condition.

The main controller MC is also communicatively connected through a cable or wireless network to a host computer HC responsible for management of the overall semiconductor manufacturing process by a plurality of substrate processing apparatuses including 100. The host computer HC comprises a memory 61 for storing programs, variables and the like, and a CPU 62 responsible for control operation according to the programs stored in the memory 61. By means of transmission of data indicative of the situation of a semiconductor substrate manufactured by each substrate processing apparatus from the main controller MC to the host computer HC through the network, the host computer HC is allowed to easily keep track of the situation of each semiconductor substrate in process.

<3. Operation of Substrate Processing Apparatus>

In the following, each operation of the indexer cell C1, the anti-reflection film processing cell C2, the resist film processing cell C3, the development cell C4, the post-exposure thermal processing cell C5, and the interface cell C6 in the substrate processing apparatus 100 will be discussed.

First, the operation in the indexer cell C1 will be discussed. In the indexer cell C1, the indexer-specific transport mechanism 7 takes an unprocessed substrate W out of the cassette C stored therein, then moving horizontally to a position opposed to the substrate holding parts PASS1 and PASS2 to transfer the unprocessed substrate W onto the substrate holding part PASS1. When the cell controller CT1 detects the presence of a processed substrate W on the substrate holding part PASS2, the cell controller CT1 causes the indexer-specific transport mechanism 7 to move horizontally to a position opposed to the substrate holding parts PASS1 and PASS2, whereby the processed substrate W on the substrate holding part PASS2 is transferred to the indexer-specific transport mechanism 7.

Next, the operation in the anti-reflection film processing cell C2 will be discussed. When the cell controller CT2 detects the presence of an unprocessed substrate W on the substrate holding part PASS1, the cell controller CT2 causes the first main transport mechanism 10A to move horizontally to a position opposed to the substrate holding parts PASS1 and PASS2, whereby the substrate W on the substrate holding part PASS1 is transferred to the first main transport mechanism 10A. The substrate W is thereafter carried into the first coating processor 8 to be subjected to coating with an anti-reflection film. The substrate W formed with the anti-reflection film then enters the first thermal processor 9 to be subjected to certain thermal process. The substrate W after being subjected to these coating and thermal processes is horizontally moved to a position opposed to the substrate holding parts PASS3 and PASS4 by the first main transport mechanism 10A, whereby the substrate W is transferred onto the upper substrate holding part PASS3.

In the anti-reflection film processing cell C2, when the cell controller CT2 detects the presence of a processed substrate W after exposure on the substrate holding part PASS4, the cell controller CT2 causes the first main transport mechanism 10A to move horizontally to a position opposed to the substrate holding parts PASS3 and PASS4, whereby the substrate W on the lower substrate holding part PASS4 is transferred to the first main transport mechanism 10A. The cell controller CT2 further causes the first main transport mechanism 10A to move horizontally to a position opposed to the substrate holding parts PASS1 and PASS2, whereby the substrate W after exposure is transferred onto the lower substrate holding part PASS2.

Next, the operation in the resist film processing cell C3 will be discussed. When the cell controller CT3 detects the presence of a substrate W coated with an anti-reflection film on the substrate holding part PASS3, the cell controller CT3 causes the second main transport mechanism 10B to move horizontally to a position opposed to the substrate holding parts PASS3 and PASS4, whereby the substrate W on the upper substrate holding part PASS3 is transferred to the second main transport mechanism 10B. The substrate W coated with the anti-reflection film is thereafter carried into the second coating processor 15 to be subjected to coating with a resist film. The substrate W formed with the resist film is then carried into the second thermal processor 16 to be subjected to certain thermal process. The substrate W after being subjected to these coating and thermal processes is horizontally moved to a position opposed to the substrate holding parts PASS5 and PASS6 by the second main transport mechanism 10B, whereby the substrate W is transferred onto the upper substrate holding part PASS5.

In the resist film processing cell C3, when the cell controller CT3 detects the presence of a substrate W after exposure on the substrate holding part PASS6, the cell controller CT3 causes the second main transport mechanism 10B to move horizontally to a position opposed to the substrate holding parts PASS5 and PASS6, whereby the substrate W on the lower substrate holding part PASS6 is transferred to the second main transport mechanism 10B. The cell controller CT3 further causes the second main transport mechanism 10B to move horizontally to a position opposed to the substrate holding parts PASS3 and PASS4, whereby the substrate W after exposure is transferred onto the lower substrate holding part PASS4.

Next, the operation in the development cell C4 will be discussed. When the cell controller CT4 detects the presence of a substrate W on the substrate holding part PASS5, the cell controller CT4 causes the third main transport mechanism 10C to move horizontally to a position opposed to the substrate holding parts PASS5 and PASS6, whereby the substrate W coated with the resist film is transferred to the third main transport mechanism 10C. The third main transport mechanism 10C is further caused to move horizontally to a position opposed to the substrate holding parts PASS7 and PASS8, whereby the substrate W coated with a resist film is transferred onto the substrate holding part PASS7.

When the cell controller CT4 detects the presence of a substrate W after exposure on the substrate holding part PASS8, the cell controller CT4 causes the third main transport mechanism 10C to move horizontally to a position opposed to the substrate holding parts PASS7 and PASS8, whereby the substrate W on the lower substrate holding part PASS8 is transferred to the third main transport mechanism 10C. Subsequently, the substrate W after exposure is carried into the development processor 30 to be subjected to development. The substrate W after development is then carried into the third thermal processor 31 to be subjected to certain thermal process. The substrate W after being subjected to these development and thermal processes is horizontally moved to a position opposed to the substrate holding parts PASS5 and PASS6 by the third main transport mechanism 10C, whereby the substrate W is transferred onto the lower substrate holding part PASS6.

Next, the operation in the post-exposure thermal processing cell C5 will be discussed. When the cell controller CT5 detects the presence of a substrate W on the substrate holding part PASS7, the cell controller CT5 causes the fourth main transport mechanism 10D to move up and down to a position opposed to the substrate holding part PASS7, whereby the substrate W coated with the resist film is transferred from the upper substrate holding part PASS7 to the fourth main transport mechanism 10D. The substrate W thus transferred is carried into the edge exposure unit EEW to be subjected to edge exposure. The substrate W after edge exposure is moved up and down to a position opposed to the substrate holding part PASS9 by the fourth main transport mechanism 10D, whereby the substrate W after edge exposure is transferred onto the upper substrate holding part PASS9.

When the cell controller CT5 detects the presence of a substrate W on the substrate holding part PASS10, the cell controller CT5 causes the fourth main transport mechanism 10D to move up and down to a position opposed to the substrate holding part PASS10, whereby the substrate W after exposure on the lower substrate holding part PASS10 is transferred to the fourth main transport mechanism 10D. Subsequently, the substrate W thus transferred is carried for post-exposure thermal process into the heater PHP constituting the third thermal processor 31 in the post-exposure thermal processing cell C5. The substrate W after post-exposure thermal process is then moved up and down to a position opposed to the substrate holding part PASS8 by the fourth main transport mechanism 10D, whereby the substrate W after post-exposure thermal process is transferred onto the lower substrate holding part PASS8. The post-exposure thermal process in the post-exposure thermal processing cell C5 will be discussed in detail later.

Next, the operation in the interface cell C6 will be discussed. When the cell controller CT6 detects the presence of a substrate W after post-exposure thermal process on the substrate holding part PASS9, the cell controller CT6 causes the interface-specific transport mechanism 35 to move to a position opposed to the substrate holding part PASS9, whereby the substrate W placed on the upper substrate holding part PASS9 is transferred to the interface-specific transport mechanism 35. The interface-specific transport mechanism 35 also transfers a substrate W to a transport mechanism in the exposure device STP not shown.

When the interface-specific transport mechanism 35 receives a substrate W after exposure from the transport mechanism of the exposure device STP not shown, the interface-specific transport mechanism 35 moves to a position opposed to the substrate holding part PASS10, whereby the substrate W after exposure is transferred onto the lower substrate holding part PASS10.

Following the foregoing operations of the cells C1 through C6, a substrate W carried into the indexer cell C1 of the substrate processing apparatus 100 is transported passing through the substrate holding parts PASS1, PASS3, PASS5, PASS7, PASS9, PASS10, PASS8, PASS6, PASS4 and PASS2 in the order named, while being subjected to coating with an anti-reflection film at the anti-reflection film processing cell C2, coating with a resist film at the resist film processing cell C3, edge exposure at the interface cell C6, post-exposure thermal process at the post-exposure thermal processing cell C5, and development at the development cell C4 in this order.

<4. Transport Process>

The substrate processing apparatus 100 of the first preferred embodiment employs a sequential transport control system for sequentially transporting a plurality of substrates with minimum possible interruption with no dependence on tact time. In the substrate processing apparatus 100, when the processing environment in a certain processing unit is adjusted, a substrate is held in standby at a position close to the processing unit, not in an indexer. After adjustment of the processing environment is completed, the substrate held in standby is transported to the processing unit.

Figure 9:
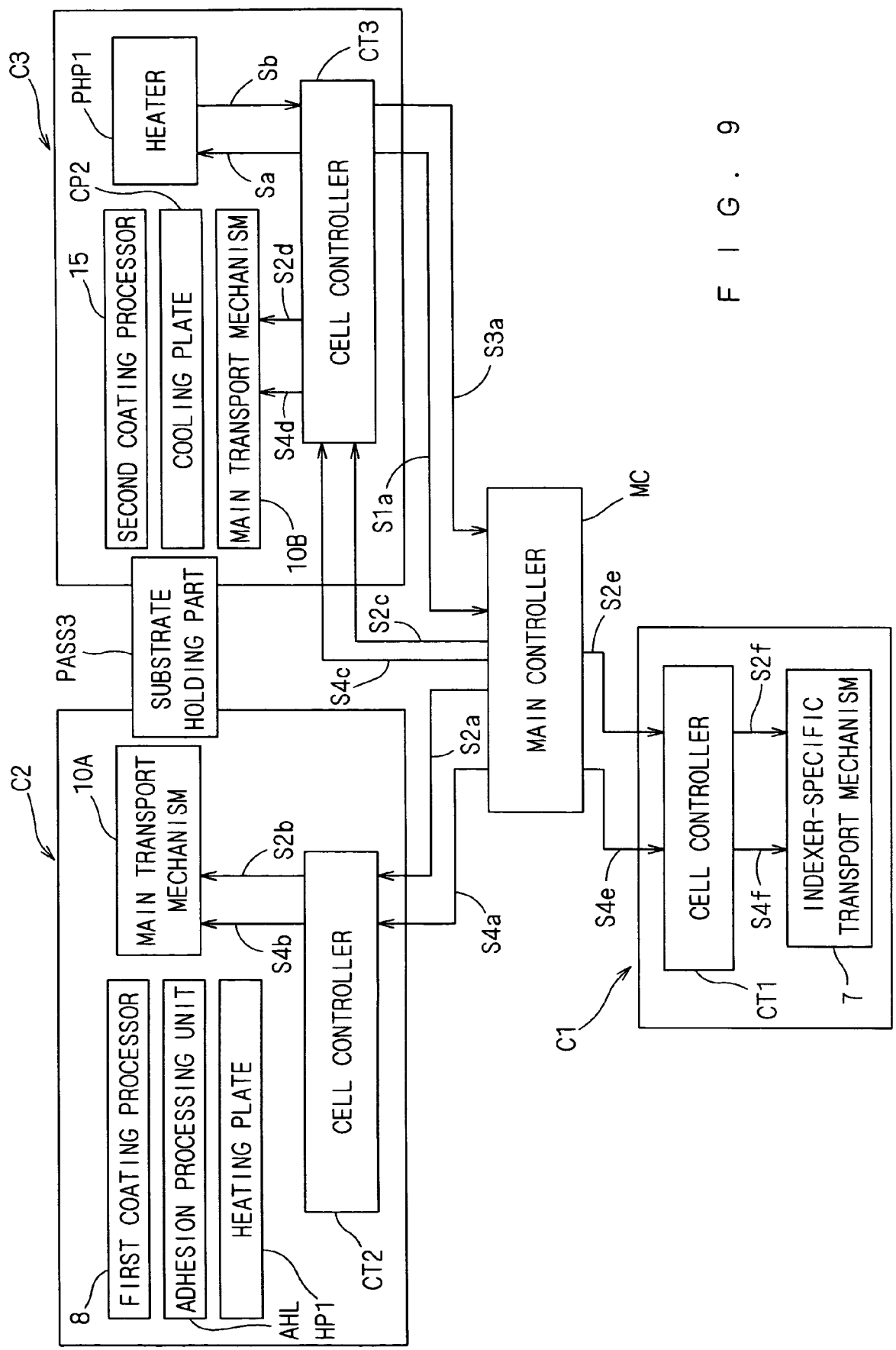
FIG. 9 is a block diagram showing the flow of control signals between an indexer cell, an anti-reflection film processing cell and a resist film processing cell, and a main controller in the substrate processing apparatus according a first preferred embodiment of the present invention.
Figure 10:
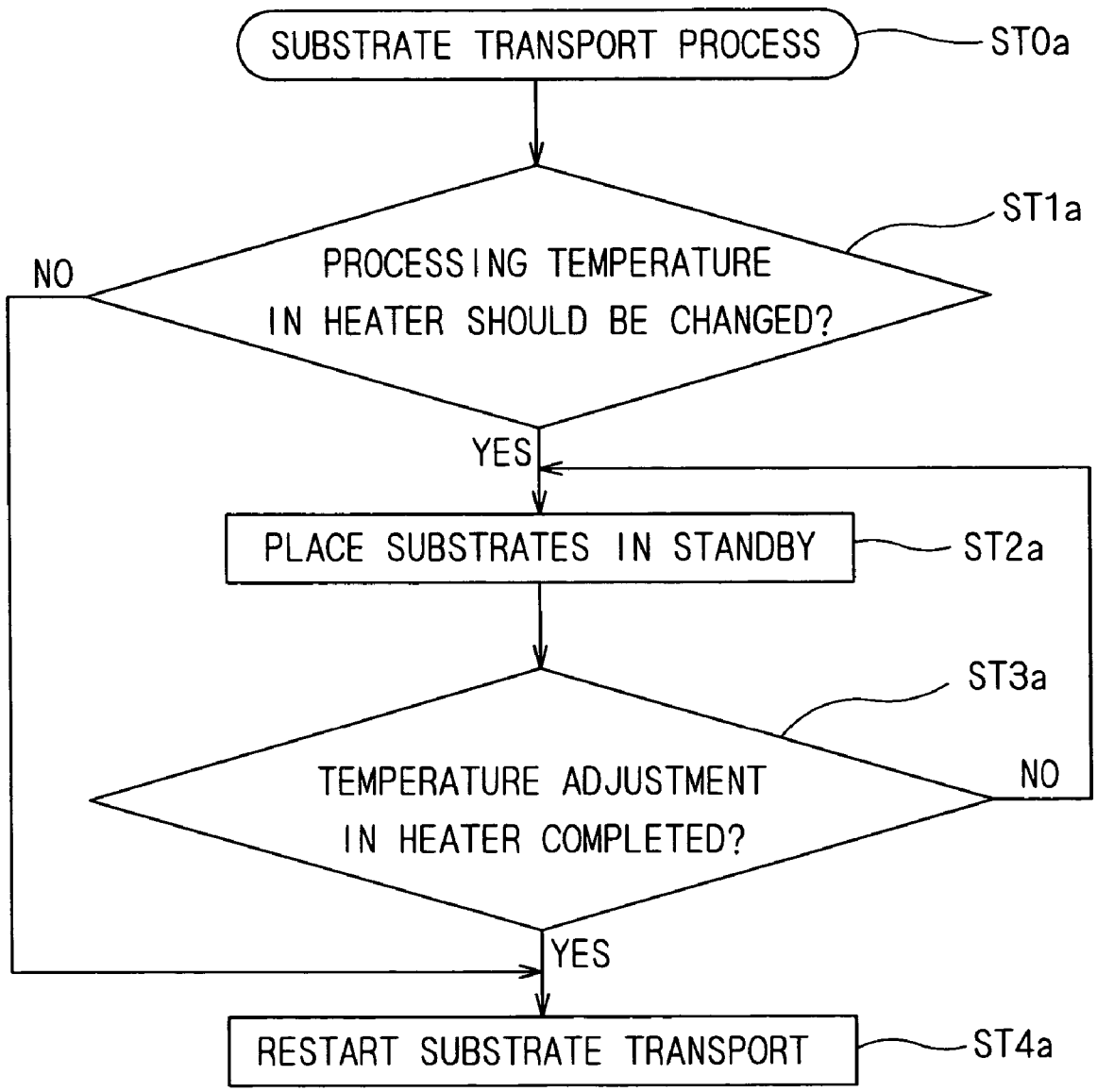
FIG. 10 is a flow chart showing the substrate transport process in the substrate processing apparatus according to the first preferred embodiment.
Figure 11:
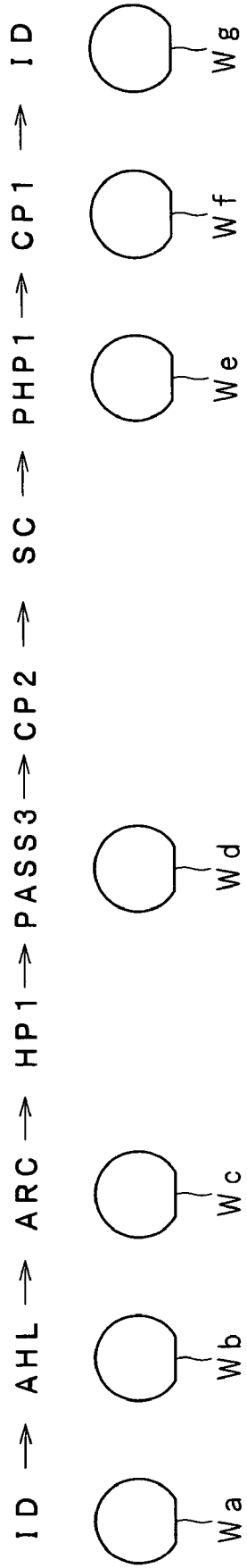
FIG. 11 shows an exemplary transport path and exemplary locations of substrates in the substrate processing apparatus according to the present invention.

The transport process of substrates will be discussed with reference to FIGS. 9 through 11. FIG. 9 is a block diagram showing the flow of control signals in the substrate processing apparatus 100 between the indexer cell C1, the anti-reflection film processing cell C2 and the resist film processing cell C3, and the main controller MC. FIG. 10 is a flow chart showing the substrate transport process in the substrate processing apparatus 100. FIG. 11 shows an exemplary transport path and exemplary locations of substrates in the substrate processing apparatus 100.

Figure 15:
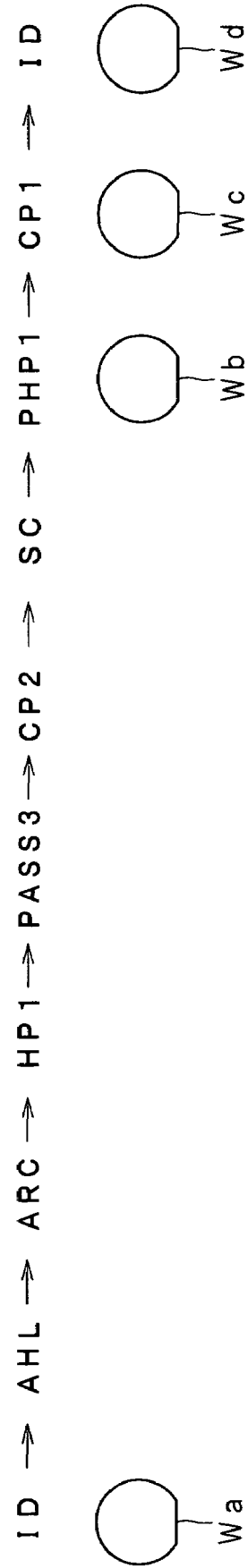
FIG. 15 shows an exemplary transport path and exemplary locations of substrates in a substrate processing apparatus in the background art.

As an example, with reference to FIG. 11, substrates follow the same transport path in the substrate processing apparatus 100 as that of FIG. 15. That is, according to the transport path of FIG. 11, substrates pass an indexer ID as the indexer cell C1, the adhesion processing unit AHL in the first thermal processor 9, an anti-reflection film processor ARC as the first coating processor 8, a heating plate HP1 in the first thermal processor 9, a heater PHP1 in the second thermal processor 16, a photoresist spin coater SC as the second coating processor 15, a cooling plate CP1 in the first thermal processor 9, a cooling plate CP2 in the second thermal processor 16, and the substrate holding part PASS3 in a predetermined order. Briefly, transport of a substrate proceeds with formation of an anti-reflection film on a substrate at the anti-reflection film processing cell C2 (by way of ID, AHL, ARC and HP1 in this order), formation of a resist film thereafter on the substrate at the resist film processing cell C3 (by way of PASS3, CP2, SC, PHP1 and CP1 in this order), followed by return of the substrate to the indexer ID.

As discussed in the description of the background art, it may be necessary to adjust processing temperature in a heating unit between lots. More specifically, it may be necessary to change the processing temperature in the heater PHP1 as a heating unit of the substrate processing apparatus 100 after a substrate We in one lot is subjected to heating in the heater PHP1, in which case the process discussed below is followed.

In the sequential transport control system discussed in the description of the background art, a substrate in a subsequent lot is carried into the heater PHP1 from the photoresist spin coater SC before adjustment of the processing temperature is completed in the heater PHP1. In response, according to the first preferred embodiment, a foremost substrate Wd among those not reaching the heater PHP1 is transported to the substrate holding part PASS3 as the entrance to the resist film processing cell C3, and transport of the foremost substrate Wd and substrates Wa through Wc following the substrate Wd is suspended until temperature control for changing the processing temperature in the heater PHP1 is completed. After adjustment of the processing environment is completed, transport of the substrates Wa through Wd is restarted.

As compared with the case in which the substrate Wd in a subsequent lot is placed in standby in the indexer ID, the substrate Wd can be fed faster to the heater PHP1 after adjustment of the processing environment, thereby suppressing throughput reduction. Such a process will be discussed below with reference to FIGS. 9 and 10.

The heater PHP1 in the resist film processing cell C3 is capable of adjusting its processing environment for heating. That is, the processing temperature as a processing environment is changeable in the heater PHP1. More specifically, in response to the control from the cell controller CT3, a substrate W can be subjected to thermal process at different processing temperatures such as 65° C., 75° C. or 85° C. Such control to provide temperature variations is easily realized by the control from the cell controller CT3 over the power required for heating at the heater PHP1 (signal Sa), and by the feedback of the temperature information from a temperature sensor (not shown) provided in the heater PHP1 to the cell controller CT3 (signal Sb). Accordingly, in response to the control instructions from a user transmitted through the main controller MC, temperature control is realized that provides a temperature of 65° C. for thermal process of substrates in a first lot, and a temperature of 75° C. for thermal process of substrates in a second lot by causing temperature rise in the heating plate HP of the heater PHP1 (see FIGS. 4A and 4B), for example.

When the processing temperature in the heater PHP1 is to be changed, the cell controller CT3 sends a signal S1$a$ to the main controller MC in response to the feedback signal Sb from the heater PHP1. The signal S1$a$ notifies the main controller MC of start of change of the processing temperature. After change of the processing temperature is completed, the cell controller CT3 sends a signal S3$a$ to the main controller MC notifying completion of change.

Next, the transport process of each substrate (step ST0$a$ in FIG. 10) will be discussed. First, the main controller MC judges whether the instructions to control given from a user include an order to change the processing temperature in the heater PHP1 between lots, namely, the main controller MC judges the presence or absence of necessity to adjust processing temperature as a processing environment in a heating unit (step ST1$a$ in FIG. 10). Such judgment is easily realized by computation in the CPU 52 based on a certain program stored in advance in the memory 51 of the main controller MC and the instructions from a user. When the instructions to control do not include the order to change the processing temperature, the main controller MC judges that the processing temperature is not to be changed in the resist film processing cell C3, and continues the transport process (step ST4$a$ in FIG. 10).

When the instructions to control include the order to change the processing temperature, namely, when there is a necessity to adjust processing temperature in the heating unit, the main controller MC keeps the foremost substrate Wd in a subsequent lot in standby on the substrate holding part PASS3 and keeps the following substrates Wc, Wb and Wa in standby at their respective positions, until the last substrate We in a lot prior to change of the processing temperature is heated in the heater PHP1, transferred from the heater PHP1, and temperature adjustment to change the processing temperature in the heater PHP1 is completed (step ST2$a$ in FIG. 10). Namely, the foremost substrate Wd among those not reaching the heater PHP1 is transported to the substrate holding part PASS3, and transport of the substrate Wd, and the following substrates Wc, Wb and Wa is stopped.

The substrates Wd, Wc, Wb and Wa are held in standby in the following way: First, the main controller MC sends control signals S2$a$ and S2$e$ to the cell controllers CT2 and CT1, respectively.

The cell controller CT2 sends a control signal S2$b$ to the main transport mechanism 10A in response to the control signal S2$a$, thereby causing the substrate Wd to move to the substrate holding part PASS3 when being placed on the main transport mechanism 10A. The substrates Wc and Wb following the substrate Wd are also transported to the anti-reflection film processor ARC and to the adhesion processing unit AHL, respectively. Thereafter transport of the substrates Wd, Wc and Wb is stopped.

With reference to FIG. 11, the substrate Wc following the substrate Wd is preferably transported to the anti-reflection film processor ARC for standby immediately before the heating plate HP1, without reaching the heating plate HP1. This is because the substrate Wc left on the heating plate HP1 may be inadvertently heated to an excessive degree, thus causing undesirable such as influence on the characteristic of an anti-reflection film formed on the substrate Wc. Such prohibition is easily observed by a control signal from the main controller MC to the cell controller CT2 obtained by computation in the CPU 52 based on a certain program stored in advance in the memory 51 of the main controller MC.

The cell controller CT1 sends a control signal S2f to the indexer-specific transport mechanism 7 in response to the control signal S2e, whereby transport of the substrate Wa is stopped to prevent outward transfer of the substrate Wa from the indexer cell C1.

During standby period, the main controller MC monitors the presence or absence of the signal S3a from the cell controller CT3 indicating completion of change of the processing temperature (step ST3a in FIG. 10). When the signal S3a is not received, the flow returns to the step ST2a in FIG. 10 so that the main controller MC keeps standby state.

When the signal S3a is received, the main controller MC becomes operative to restart transport process of each substrate (step ST4a in FIG. 10).

More specifically, the main controller MC sends a control signal S4c to the cell controller CT3, in response to which the cell controller CT3 sends a control signal S4d to the main transport mechanism 10B. The main transport mechanism 10B is thereby caused to take the substrate Wd from the substrate holding part PASS3, and transport the substrate Wd to the cooling plate CP2.

The main controller MC further sends a control signal S4a to the cell controller CT2, in response to which the cell controller CT2 sends a control signal S4b to the main transport mechanism 10A. The main transport mechanism 10A is thereby caused to take the substrate Wc out of the anti-reflection film processor ARC to transport the same to the heating plate HP1. The main transport mechanism 10A is also caused to take the substrate Wb out of the adhesion processing unit AHL to transport the same to the anti-reflection film processor ARC.

The main controller MC also sends a control signal S4e to the cell controller CT1, in response to which the cell controller CT1 sends a control signal S4f to the indexer-specific transport mechanism 7. The indexer-specific transport mechanism 7 is thereby caused to transport the substrate Wa to the anti-reflection film processing cell C2.

In the first preferred embodiment, the main controller MC, the cell controllers CT1 through CT3, the indexer-specific transport mechanism 7, and the main transport mechanisms 10A and 10B are collectively considered as the transport means of the substrates Wa through Wd. With reference to FIG. 11, this transport means serves to carry substrates between the indexer ID, the adhesion processing unit AHL, the anti-reflection film processor ARC, the heating plate HP1, the heater PHP1, the photoresist spin coater SC, the cooling plates CP1 and CP2, and the substrate holding part PASS3.

According to the first preferred embodiment, when the processing temperature as a processing environment in the heater PHP1 is to be changed, the substrates Wa through Wc following the foremost substrate Wd continue to be transported until the foremost substrate Wd among those not reaching the heater PHP1 is placed on the substrate holding part PASS3 which is closer to the heater PHP1 than the indexer ID. Thereafter transport of the substrates Wa through Wd is stopped. After temperature adjustment to change the processing temperature is completed, transport of the substrates Wa through Wd is restarted. As compared with the case in which the substrate Wd is placed in standby in the indexer ID, the substrate Wd can be fed faster to the heater PHP1 after change of the processing temperature. As a result, throughput reduction can be suppressed.

In the foregoing discussion, the substrate holding part PASS3 is used to place the substrate Wd thereon for standby. The substrate Wd may be held in standby at an alternative position other than the substrate holding part PASS3. That is, the foremost substrate Wd among those not reaching the heater PHP1 may be placed on an alternative member, as long as this member is in a post-stage of the indexer ID and an ante-stage of the heater PHP1, capable of placing thereon a substrate transferred from the indexer ID during suspension of transport. As discussed, those which cause adverse effect on a substrate such as the heating plate HP1 are unsuitable for placing a substrate during standby.

Figure 12:
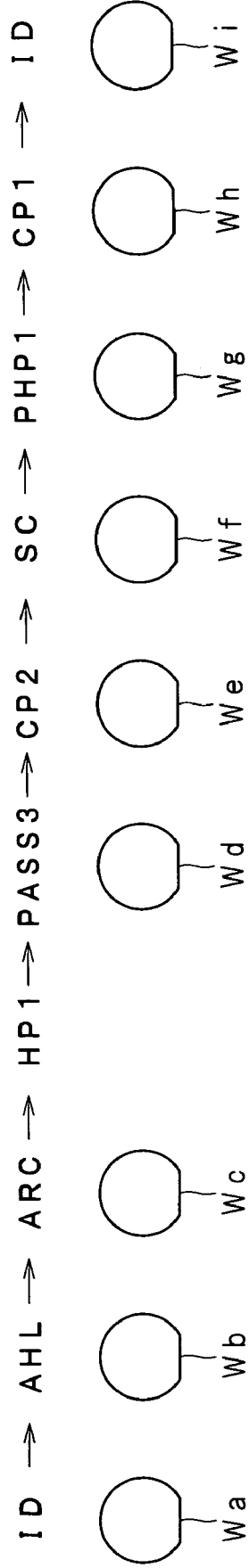
FIG. 12 shows another exemplary transport path and other exemplary locations of substrates in the substrate processing apparatus according to the present invention.

FIG. 12 shows an exemplary application of the photoresist spin coater SC as a member for holding thereon a foremost substrate among those not reaching the heater PHP1 during suspension of transport. With reference to FIG. 12, a foremost substrate Wf among those not reaching the heater PHP1 is held in standby on the photoresist spin coater SC until temperature adjustment to change the processing temperature is completed in the heater PHP1. The substrates We, Wd, Wc, Wb and Wa following the substrate Wf are respectively held in standby on the cooling plate CP2, on the substrate holding part PASS3, on the anti-reflection film processor ARC, on the adhesion processing unit AHL, and in the indexer ID.

As discussed, a substrate may be placed in standby at an arbitrary position in the substrate processing apparatus 100. However, arrangement of FIG. 12 in which the foremost substrate Wf among those not reaching the heater PHP1 is held in standby at the position closest to the heater PHP1 allows the substrate Wf to be transferred to the heater PHP1 at the instant of restart of transport, which naturally provides a high degree of effectiveness in suppression of throughput reduction.

<Second Preferred Embodiment>

A second preferred embodiment of the present invention is a modification of the first preferred embodiment. When a processing unit responsible for formation of a coating in liquid form on a substrate (i.e., a liquid coater) makes adjustment of an environment for coating as a processing environment by means of cleaning, substrate transport is stopped and restarted in the same way as in the first preferred embodiment. In the substrate processing apparatus 100 of the second preferred embodiment, the substrate transport path shown in FIG. 12 is also followed.

Figure 13:
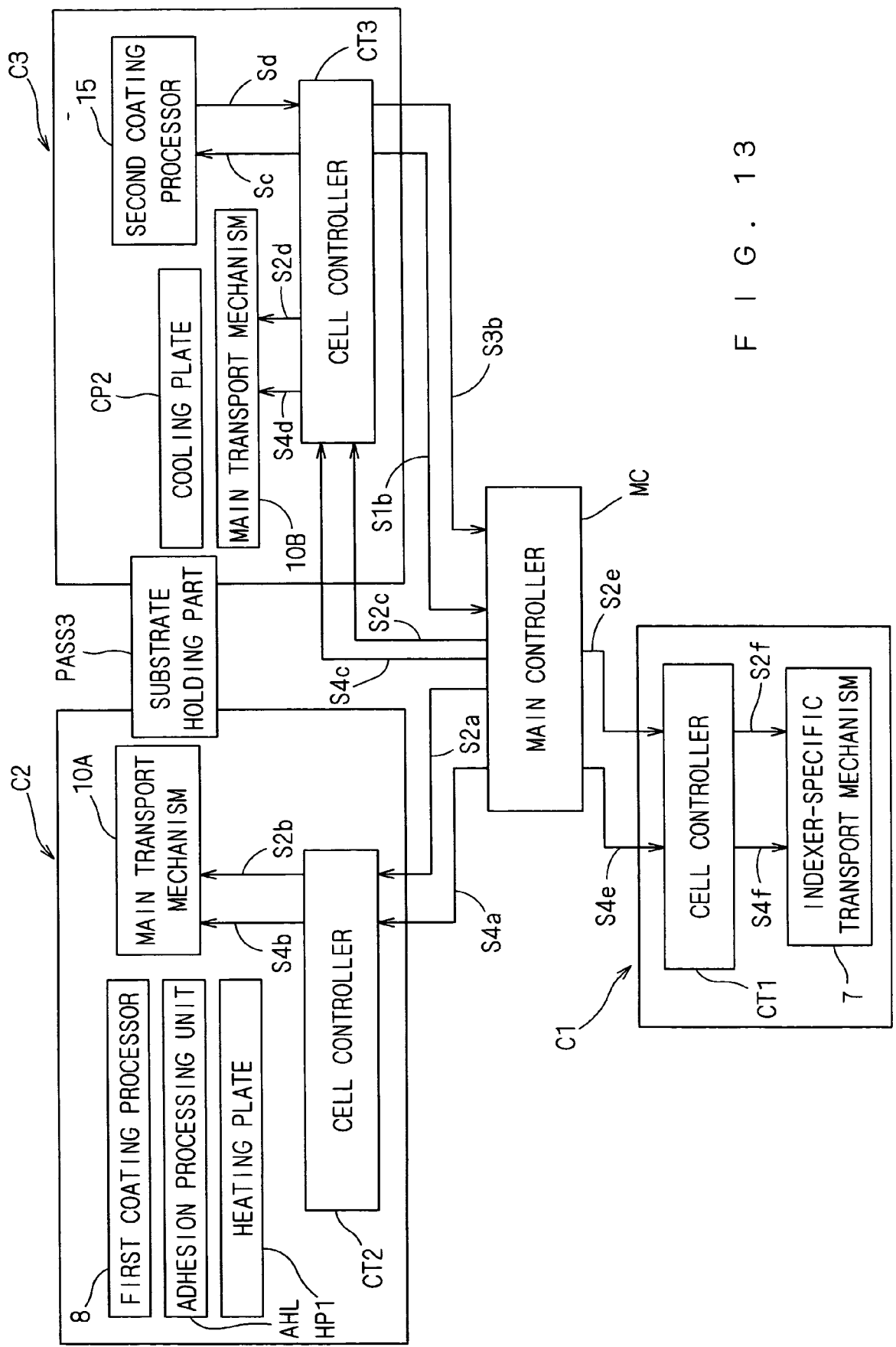
FIG. 13 is a block diagram showing the flow of control signals between an indexer cell, an anti-reflection film processing cell and a resist film processing cell, and a main controller in the substrate processing apparatus according to a second preferred embodiment of the present invention.
Figure 14:
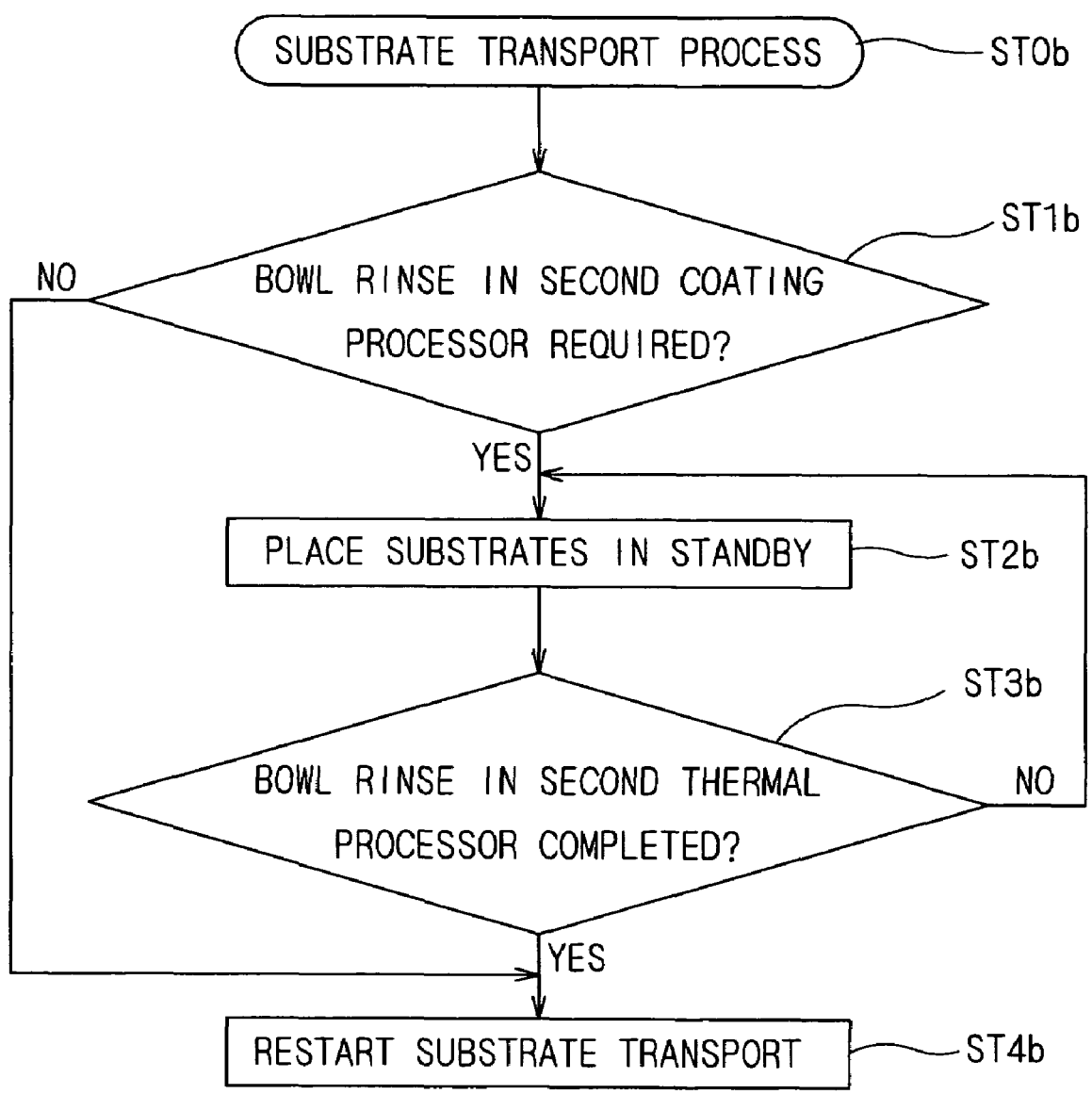
FIG. 14 is a flow chart showing the substrate process in the substrate processing apparatus according to the second preferred embodiment.

The transport process of substrates will be discussed with reference to FIGS. 13 and 14. FIG. 13 is a block diagram showing the flow of control signals in the substrate processing apparatus 100 between the indexer cell C1, the anti-reflection film processing cell C2 and the resist film processing cell C3, and the main controller MC. FIG. 14 is a flow chart showing the substrate transport process in the substrate processing apparatus 100.

The photoresist spin coater SC as the second coating processor 15 is subjected to bowl rinse. Bowl rinse means quick cleaning in the photoresist spin coater SC to keep the cup of the coater SC clean by means of discharge of a small amount of solvent.

In the sequential transport control system as discussed in the description of the background art, a subsequent substrate is transferred from the cooling plate CP2 into the photoresist spin coater SC before bowl rinse is completed in the photoresist spin coater SC. In response, according to the second preferred embodiment, the foremost substrate We among those not reaching the photoresist spin coater SC (see FIG. 12) is transported to the cooling plate CP2 immediately before the photoresist spin coater SC, and transport of the foremost substrate We and the substrates Wa through Wd following the substrate We is suspended until adjustment of the processing environment is completed in the photoresist spin coater SC. After adjustment of the processing environment is completed, transport of the substrates Wa through We is restarted.

As compared with the case in which the subsequent substrate We is placed in standby in the indexer ID, the substrate We can be fed faster to the photoresist spin coater SC after adjustment of the processing environment, thereby suppressing throughput reduction. Such a process will be discussed below with reference to FIGS. 13 and 14.

In the photoresist spin coater SC, each time a predetermined number of substrates are subjected to coating, bowl rinse is allowed on the basis of the control from the cell controller CT3. Such control of bowl rinse is easily realized by the control from the main controller MC over a solvent discharge part for bowl rinse (not shown) provided in the photoresist spin coater SC (signal Sc), and by the feedback of the number of substrates after being subjected to coating from a counter (not shown) provided in the photoresist spin coater SC to the cell controller CT3 (signal Sd). Accordingly, in response to the control instructions from a user transmitted through the main controller MC, the resist film processing cell C3 can be caused to perform bowl rinse each time 100 substrates are subjected to coating, for example, When bowl rinse is to be performed in the photoresist spin coater SC, the cell controller CT3 sends a signal S1$b$ to the main controller MC in response to the feedback signal Sd from the photoresist spin coater SC. The signal Sd notifies the main controller MC of the information about the number of substrates after coating. After bowl rinse is completed, the cell controller CT3 sends a signal S3$b$ to the main controller MC notifying completion of bowl rinse.

Next, the transport process of each substrate (step ST0$b$ in FIG. 14) will be discussed. First, the main controller MC judges the presence or absence of necessity to perform bowl rinse in the photoresist spin coater SC before a subsequent substrate in a subsequent lot is transferred thereinto, namely, the main controller MC judges the presence or absence of necessity to adjust environment for coating by means of bowl rinse in the second coating processor 15 (step ST1$b$ in FIG. 14). Such judgment is easily realized by computation in the CPU 52 based on a certain program stored in advance in the memory 51 of the main controller MC and the signal S1$b$. When there is no necessity to perform bowl rinse before a subsequent substrate is transferred into the photoresist spin coater SC, the main controller MC continues the transport process (step ST4$b$ in FIG. 14).

When there is necessity to perform bowl rinse (namely, when the processing environment should be adjusted) in the photoresist spin coater SC before a subsequent substrate is transferred into the photoresist spin coater SC, the main controller MC keeps the subsequent substrate We in standby at the cooling unit CP2 and keeps the following substrates Wd, Wc, Wb and Wa in standby at their respective positions, until the substrate Wf immediately before bowl rinse (see FIG. 12) is coated with a photoresist at the photoresist spin coater SC, transferred from the photoresist spin coater SC, and bowl rinse is completed (step ST2$b$ in FIG. 14). Namely, the foremost substrate We among those not reaching the photoresist spin coater SC is transported to the cooling plate CP2, and transport of the substrate We, and the following substrates Wd, Wc, Wb and Wa is stopped.

The substrates We, Wd, Wc, Wb and Wa are held in standby in the following way: First, the main controller MC sends the control signals S2$c$, S2$a$ and S2$e$ to the cell controllers CT3, CT2 and CT1, respectively.

The cell controller CT3 sends a control signal S2$d$ to the main transport mechanism 10B in response to the control signal S2$c$, thereby causing the substrate We to move to the cooling plate CP2 when being placed on the main transport mechanism 10B. Thereafter transport of the substrate We is stopped.

The cell controller CT2 sends the control signal S2$b$ to the main transport mechanism 10A in response to the control signal S2$a$, thereby causing the substrate Wd to move to the substrate holding part PASS3 when being place on the main transport mechanism 10A. The substrates Wc and Wb following the substrate Wd are transported to the anti-reflection film processor ARC and to the adhesion processing unit AHL, respectively. Thereafter transport of the substrates Wd, Wc and Wb is stopped.

With reference to FIG. 12, the substrate Wc following the substrate Wd is preferably transported to the anti-reflection film processor ARC for standby immediately before the heating plate HP1, without reaching the heating plate HP1. This is because the substrate Wc left on the heating plate HP1 may be inadvertently heated to an excessive degree, thus causing undesirable such as influence on the characteristic of an anti-reflection film formed on the substrate Wc. Such prohibition is easily observed by a control signal from the main controller MC to the cell controller CT2 obtained by computation in the CPU 52 based on a certain program stored in advance in the memory 51 of the main controller MC.

The cell controller CT1 sends the control signal S2$f$ to the indexer-specific transport mechanism 7 in response to the control signal S2$e$, whereby transport of the substrate Wa is stopped to prevent outward transfer of the substrate Wa from the indexer cell C1.

During standby period, the main controller MC monitors the presence or absence of the signal S3$b$ from the cell controller CT3 indicating completion of bowl rinse (step ST3$b$ in FIG. 14). When the signal S3$b$ is not received, the flow returns to the step ST2$b$ in FIG. 14 so that the main controller MC keeps standby state.

When the signal S3$b$ is received, the main controller MC becomes operative to restart transport process of each substrate (step ST4$b$ in FIG. 14).

More specifically, the main controller MC sends the control signal S4$c$ to the cell controller CT3, in response to which the cell controller CT3 sends the control signal S4$d$ to the main transport mechanism 10B. The main transport mechanism 10B is thereby caused to take the substrate We out of the cooling plate CP2, and transport the substrate We to the photoresist spin coater SC as the second coating processor 15. The cell controller CT3 also causes the main transport mechanism 10B to take the substrate Wd from the substrate holding part PASS3, and transport the substrate Wd to the cooling plate CP2.

The main controller MC further sends the control signal S4$a$ to the cell controller CT2, in response to which the cell controller CT2 sends the control signal S4$b$ to the main transport mechanism 10A. The main transport mechanism 10A is thereby caused to take the substrate Wc out of the anti-reflection film processor ARC to transport the same to the heating plate HP1. The main transport mechanism 10A is also caused to take the substrate Wb out of the adhesion processing unit AHL to transport the same to the anti-reflection film processor ARC.

The main controller MC also sends the control signal S4e to the cell controller CT1, in response to which the cell controller CT1 sends the control signal S4f to the indexer-specific transport mechanism 7. The indexer-specific transport mechanism 7 is thereby caused to transport the substrate Wa to the anti-reflection film processing cell C2.

In the second preferred embodiment, the main controller MC, the cell controllers CT1 through CT3, the indexer-specific transport mechanism 7, and the main transport mechanisms 10A and 10B are collectively considered as the transport means of the substrates Wa through We. With reference to FIG. 12, this transport means serves to carry substrates between the indexer ID, the adhesion processing unit AHL, the anti-reflection film processor ARC, the heating plate HP1, the heater PHP1, the photoresist spin coater SC, the cooling plates CP1 and CP2, and the substrate holding part PASS3.

According to the second preferred embodiment, when bowl rinse as cleaning is to be performed in the photoresist spin coater SC as a processing unit responsible for formation of a coating in liquid form, the substrates Wa through Wd following the foremost substrate We continue to be transported until the foremost substrate We among those not reaching the photoresist spin coater SC is located in the cooling plate CP2 which is closer to the photoresist spin coater SC than the indexer ID. Thereafter transport of the substrates Wa through We is stopped. After adjustment of the environment for coating by means of bowl rinse is completed, transport of the substrates Wa through We is restarted. As compared with the case in which the substrate We is placed in standby in the indexer ID, the substrate We can be fed faster to the photoresist spin coater SC after bowl rinse. As a result, throughput reduction can be suppressed.

In the foregoing discussion, the cooling plate CP2 is used to place the substrate We thereon for standby. The substrate We may be held in standby at an alternative position other than the cooling plate CP2. That is, the foremost substrate We among those not reaching the photoresist spin coater SC may be placed on an alternative member, as long as this member is in a post-stage of the indexer ID and an ante-stage of the photoresist spin coater SC, capable of placing thereon a substrate transferred from the indexer ID during suspension of transport. As discussed, those which cause adverse effect on a substrate such as the heating plate HP1 are unsuitable for placing a substrate during standby.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus employing a sequential transport control system in which a plurality of substrates are sequentially transported with no dependence on tact time, said substrate processing apparatus comprising:
   an indexer block including an indexer for receiving unprocessed substrates to feed said unprocessed substrates toward a plurality of processing blocks;
   said plurality of processing blocks including a processing unit responsible for a predetermined process on said substrates, said processing unit capable of adjusting a processing environment for said predetermined process;
   substrate holding parts for transferring said substrates between said indexer block and an adjacent one of said plurality of processing blocks;
   an indexer-specific transport mechanism provided in said indexer block for transferring said substrates between one of said substrate holding parts and a corresponding cassette capable of storing said substrates;
   a main transport mechanism respectively provided in said plurality of processing blocks, each transferring said substrates between a corresponding one of said substrate holding parts and said processing unit; and
   a controller,
   wherein in the event of adjustment of said processing environment in said processing unit in a first processing block of said plurality of processing blocks, said controller controls operation of said indexer-specific transport mechanism and each of said main transport mechanisms to:
   i) continue transporting a foremost substrate and substrates that follow said foremost substrate among said substrates not reaching said processing unit in said first processing block until said foremost substrate is placed on one of said substrate holding parts that is located immediately in front of said first processing blocks;
   ii) stop the transport process when said foremost substrate is transferred to said one of said substrate holding parts that is located immediately in front of said first processing block; and
   iii) restart said transport process after receipt of notification of completion of adjustment.

2. The substrate processing apparatus according to claim 1, wherein said processing unit is a heating part, and
   wherein adjustment of said processing environment is temperature adjustment for changing a processing temperature for substrate heating process.

3. The substrate processing apparatus according to claim 1, wherein said processing unit is a liquid coater; and
   wherein adjustment of said processing environment is cleaning of said liquid coater.

4. The substrate processing apparatus according to claim 1,
   wherein said controller includes:
   cell controllers for independently controlling said indexer-specific transport mechanism included in said indexer block and said main transport mechanisms respectively included in said plurality of processing blocks; and
   a main controller connected to said cell controllers,
   wherein said main controller supplies a signal to said cell controllers, and
   wherein said cell controllers respectively control operation of said indexer-specific transport mechanism and said main transport mechanisms.

5. A method of controlling a substrate processing apparatus in which a plurality of substrates are sequentially transported independently of tact time from an indexer to a processing unit via a substrate holding part, said method comprising the steps of:
   a) feeding unprocessed substrates from an indexer block toward a plurality of processing blocks by an indexer-specific transport mechanism included in said indexer block and main transport mechanisms respectively included in said plurality of processing blocks;
   b) adjusting a processing environment in a processing unit in a first processing block in said plurality of processing blocks, in accordance with substrate processing;
   c) after the start of said step b), continuing transporting a foremost substrate and substrates that follow said foremost substrate among said substrates not reaching said processing unit in said first processing block until said foremost substrate is placed on one of a plurality of substrate holding parts that is located immediately in front of said first processing block;

d) stopping the transport process when said foremost substrate is transferred to said one of said substrate holding parts that is located immediately in front of said first processing block; and e) restarting said transport process in response to completion of adjustment of said processing environment.

6. The method according to claim 5, wherein said processing unit is a heating part, and wherein adjustment of said processing environment is temperature adjustment for changing a processing temperature for substrate heating process.

7. The method according to claim 5, wherein said processing unit is a liquid coater; and wherein adjustment of said processing environment is cleaning of said liquid coater.

8. The method according to claim 5, wherein the step c) comprises the steps of c-1) transporting said second substrate to a non-heating position, and c-2) stopping said second substrate at said non-heating position.

9. The method according to claim 5, wherein a first control signal is supplied from said main controller to said cell controllers and a second control signal is supplied from said cell controllers to said indexer-specific transport mechanism and said main transport mechanisms, respectively, on the basis of said first control signal, whereby said steps c) and d) are executed, and wherein a third control signal is supplied from said main controller to said cell controllers after an adjustment completion signal is supplied from said cell controllers to said main controller, and a fourth control signal is supplied from said cell controllers to said indexer-specific transport mechanism and said main transport mechanisms, respectively, on the basis of said third control signal, whereby said step e) is executed.

* * * * *